US012062560B2

(12) United States Patent
Raschke et al.

(10) Patent No.: US 12,062,560 B2
(45) Date of Patent: *Aug. 13, 2024

(54) RETICLE POD HAVING SIDE CONTAINMENT OF RETICLE

(71) Applicant: ENTEGRIS, INC., Billerica, MA (US)

(72) Inventors: Russ V. Raschke, Chanhassen, MN (US); Shawn D. Eggum, Lonsdale, MN (US); Barry Lee Gregerson, Deephaven, MN (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/107,325

(22) Filed: Feb. 8, 2023

(65) Prior Publication Data

US 2023/0187246 A1 Jun. 15, 2023

Related U.S. Application Data

(60) Division of application No. 17/089,987, filed on Nov. 5, 2020, now Pat. No. 11,594,437, which is a continuation of application No. 16/319,093, filed as application No. PCT/US2017/048396 on Aug. 24, 2017, now abandoned.

(60) Provisional application No. 62/422,229, filed on Nov. 15, 2016, provisional application No. 62/405,518, filed on Oct. 7, 2016, provisional application No. 62/380,377, filed on Aug. 27, 2016.

(51) Int. Cl.
*H01L 21/673* (2006.01)
(52) U.S. Cl.
CPC .. *H01L 21/67359* (2013.01); *H01L 21/67369* (2013.01)

(58) Field of Classification Search
CPC .. B65D 85/48; G03F 1/66; G03F 7/20; H01L 21/67; H01L 21/673; H01L 21/67346; H01L 21/67359; H01L 21/67369; H01L 21/67383
See application file for complete search history.

(56) References Cited

U.S. PATENT DOCUMENTS

| | | | |
|---|---|---|---|
| 5,184,723 A | 2/1993 | Karl et al. | |
| 5,452,795 A | 9/1995 | Gallagher et al. | |
| 5,611,452 A | 3/1997 | Bonora et al. | |
| 5,960,960 A | 10/1999 | Yamamoto | |
| 6,825,916 B2 | 11/2004 | Wiseman et al. | |
| 7,450,219 B2 | 11/2008 | Matsutori et al. | |
| 7,743,925 B1 | 6/2010 | Lu et al. | |
| 8,083,063 B2 | 12/2011 | Lu et al. | |
| 8,220,630 B1 | 7/2012 | Ku et al. | |
| 8,613,359 B2 | 12/2013 | Kolbow et al. | |
| 2004/0004704 A1 | 1/2004 | Wiseman et al. | |
| 2005/0109667 A1 | 5/2005 | Burns et al. | |

(Continued)

FOREIGN PATENT DOCUMENTS

| | | |
|---|---|---|
| JP | 2000010281 A | 1/2000 |
| JP | 2004071729 A | 3/2004 |

(Continued)

*Primary Examiner* — Bryon P Gehman

(57) ABSTRACT

A reticle pod includes an outer pod, an inner pod cover and an inner base plate. A reticle is supported on the base and is contained within the environment created by the inner pod cover and the inner pod base. The inner pod cover can include a plurality of reticle retainers configured to contact a side wall of the reticle and limit movement of the reticle in a horizontal direction.

6 Claims, 31 Drawing Sheets

(56) References Cited

U.S. PATENT DOCUMENTS

| | | | |
|---|---|---|---|
| 2006/0109449 A1 | 5/2006 | Matsutori et al. | |
| 2007/0085992 A1 | 4/2007 | Chiu | |
| 2012/0175279 A1 | 7/2012 | Ku et al. | |

FOREIGN PATENT DOCUMENTS

| | | |
|---|---|---|
| JP | 3120494 U | 4/2006 |
| JP | 2006184442 A | 7/2006 |
| JP | 2009510525 A | 3/2009 |
| JP | 2014527291 A | 10/2014 |
| TW | 200527149 A | 8/2005 |
| TW | M295333 U | 8/2006 |
| TW | 201228902 A | 7/2012 |
| TW | 201420462 A | 6/2014 |
| WO | 2016094398 A1 | 6/2016 |

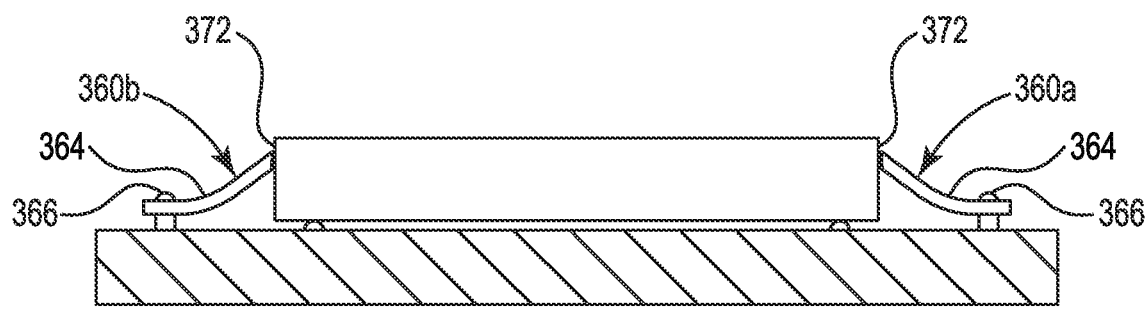
Fig. 7
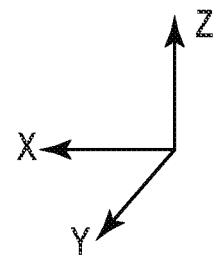

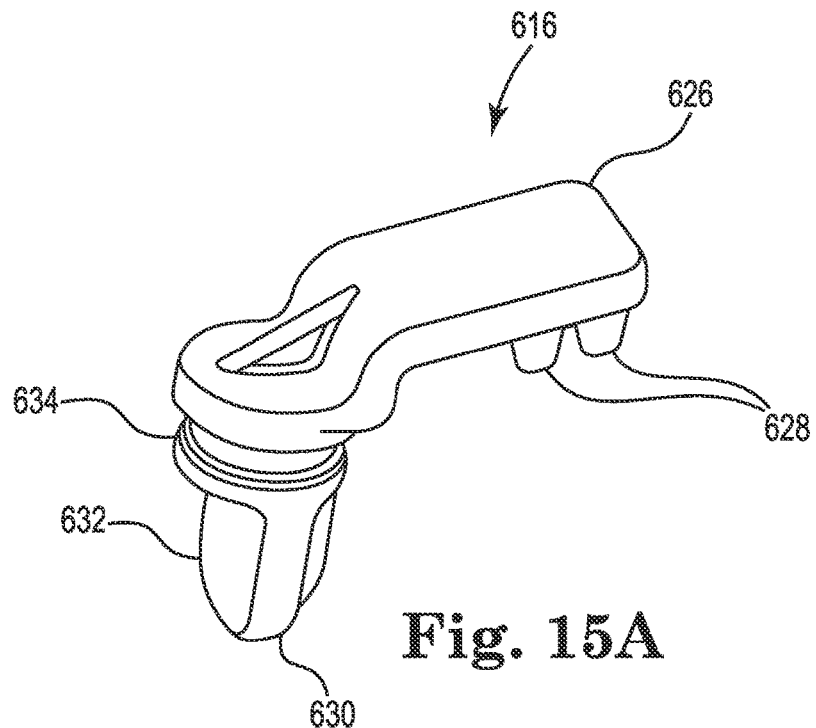
Fig. 15A
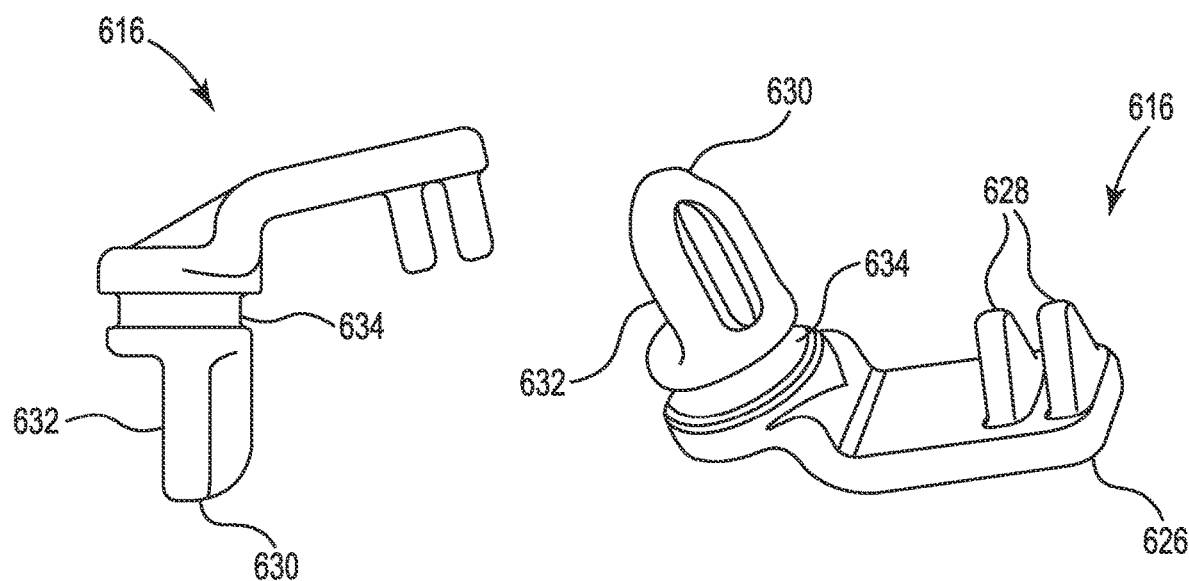
Fig. 15B
Fig. 15C

RETICLE POD HAVING SIDE CONTAINMENT OF RETICLE

PRIORITY

This application claims the benefit of U.S. Provisional Application Ser. No. 62/380,377, filed Aug. 27, 2016, entitled "RETICLE POD HAVING SIDE CONTAINMENT OF RETICLE," U.S. Provisional Application Ser. No. 62/405,518, filed Oct. 7, 2016, entitled "RETICLE POD HAVING SIDE CONTAINMENT OF RETICLE," and U.S. Provisional Application Ser. No. 62/422,229, filed Nov. 15, 2016, entitled "RETICLE POD HAVING SIDE CONTAINMENT OF RETICLE" each of these applications being incorporated herein by reference in its entirety.

TECHNICAL FIELD

The present disclosure relates generally to containers for storing, transporting, shipping and/or processing fragile devices such as photomasks, reticles and wafers. More particularly, the present disclosure relates to a dual containment pod for reticles having an inner pod incorporating a reticle retainer that limits or restricts movement in a horizontal direction in an effort to minimize particle generation within the pod.

BACKGROUND

One of the process steps commonly encountered in the fabrication of integrated circuits and other semiconductor devices is photolithography. Broadly, photolithography involves selectively exposing a specially prepared wafer surface to a source of radiation using a patterned template to create an etched surface layer. Typically, the patterned template is a reticle, which is a very flat glass plate that contains the patterns to be reproduced on the wafer. For example, the wafer surface may be prepared by first depositing silicon nitride on it followed by a coating of a light-sensitive liquid polymer or photoresist. Next, ultraviolet (UV) light is shone through or reflected off a surface of a mask or reticle to project the desired pattern onto the photoresist-covered wafer. The portion of the photoresist exposed to the light is chemically modified and remains unaffected when the wafer is subsequently subjected to a chemical media that removes the unexposed photoresist leaving the modified photoresist on the wafer in the exact shape of the pattern on the mask. The wafer is then subjected to an etch process that removes the exposed portion of the nitride layer leaving a nitride pattern on the wafer in the exact design of the mask. This etched layer, singly or in combination with other similarly created layers, represent the devices and interconnects between devices characterizing the "circuitry" of a particular integrated circuit or semiconductor chip.

With EUV, reflection from the patterned surface is used as opposed to transmission through the reticle characteristic of deep ultraviolet light photolithography. Consequently, the reflective photomask (reticle) employed in EUV photolithography is susceptible to contamination and damage to a far greater degree than reticles used in conventional photolithography. Unnecessary and unintended contact between the reticle and other surfaces during manufacturing, processing, shipping, handling, transport or storage is undesirable in view of the susceptibility of the reticle's delicate features to damage due to sliding friction and/or abrasion.

SUMMARY OF THE INVENTION

The present disclosure relates generally to containers for storing, transporting, shipping and/or processing fragile devices such as photomasks, reticles and wafers, and more particularly to a dual containment reticle pod having an inner pod incorporating a reticle retainer that limits or restricts movement in the X and Y directions in an effort to minimize particle generation within the pod. The reticle retainers, as described herein are configured to contact a side wall of the reticle housed within the inner pod and, in some cases, minimize the amount of load that is applied to a top surface of the reticle in a Z direction.

In some embodiments, a reticle pod for holding a reticle includes: a base configured to support a reticle thereon; a cover having a top surface and configured to mate with the base; and one or more reticle retainers each including a reticle contact member configured to contact a side wall of a reticle to limit movement of the reticle. Each reticle contact member includes an outwardly extending arm and a downwardly extending leg that extends through the cover, wherein upon actuation of the arm, the downwardly extending leg is configured to move in a direction toward a side wall of a reticle. In one embodiment, the reticle pod can be contained within an outer pod having an outer pod base and an outer pod cover configured to mate with the outer pod base. The outer pod cover includes an inner surface and at least one contact pad extending from the inner surface such that it contacts and actuates the outwardly extending arm of the reticle pod when the reticle pod is contained within the outer pod causing the downwardly extending leg to move in a direction toward the side wall of the reticle.

In other embodiments, a method of retaining a reticle includes: receiving a reticle on a base having features configured to support the reticle thereon; placing a cover on the base including the reticle to define an inner pod, the cover including one or more reticle retainers each including a reticle contact member, each reticle contact member including an outwardly extending arm that is extends at least partially above the top surface of the cover and a downwardly extending leg that extends through the cover; and limiting movement of the reticle.

BRIEF DESCRIPTION OF THE DRAWING

The disclosure may be more completely understood in consideration of the following description of various illustrative embodiments in connection with the accompanying drawings, in which:

FIG. 7 is a schematic, partial cross-sectional view of an inner pod with the cover removed including yet another reticle retainer in accordance with an embodiment of the disclosure.

FIGS. 15A-15C show various views of a reticle contact member according to an embodiment of the disclosure.

Figure 1:
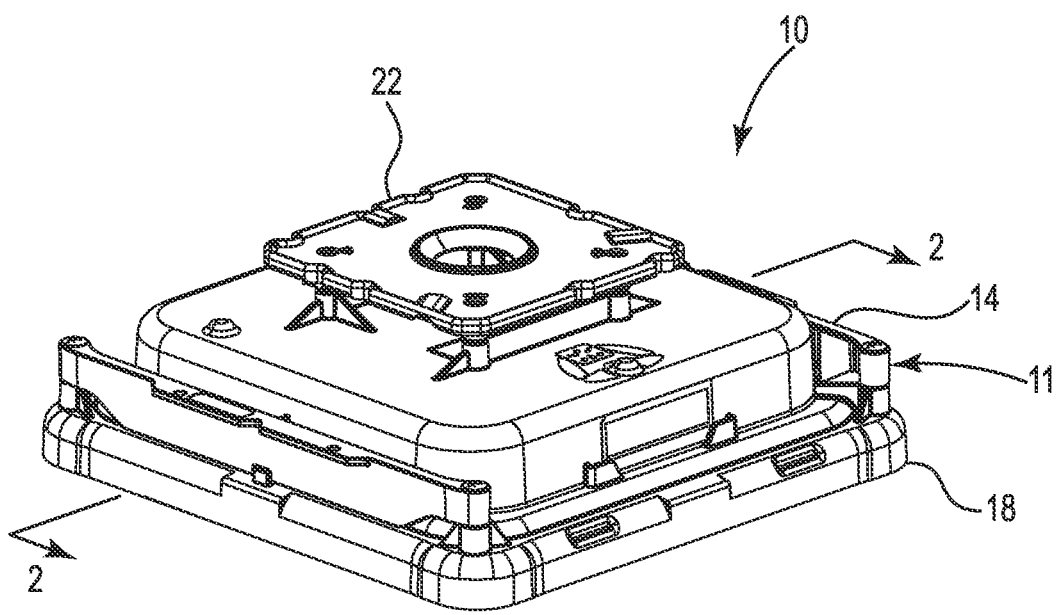
FIG. 1 is an isometric view of an exemplary reticle pod.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DETAILED DESCRIPTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The following detailed description should be read with reference to the drawings in which similar elements in different drawings are numbered the same. The detailed description and the drawings, which are not necessarily to scale, depict illustrative embodiments and are not intended to limit the scope of the invention. The illustrative embodiments depicted are intended only as exemplary. Selected features of any illustrative embodiment may be incorporated into an additional embodiment unless clearly stated to the contrary.

Figure 2:
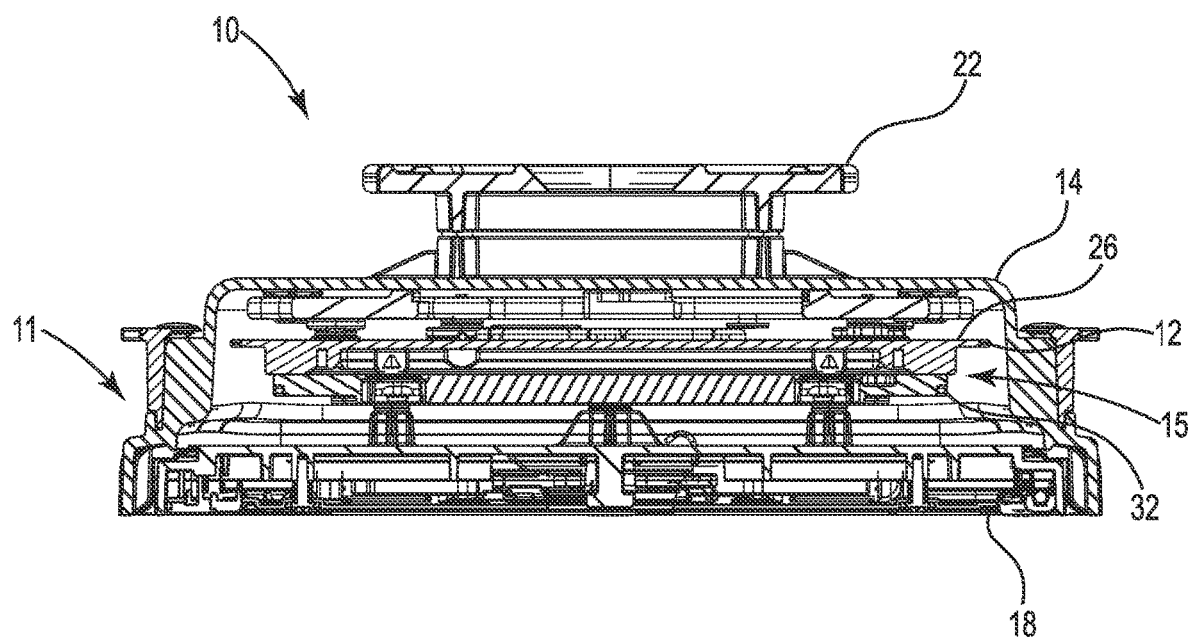
FIG. 2 is a cross-sectional view the reticle pod shown in FIG. 1 taken along line 2-2.
Figure 3:
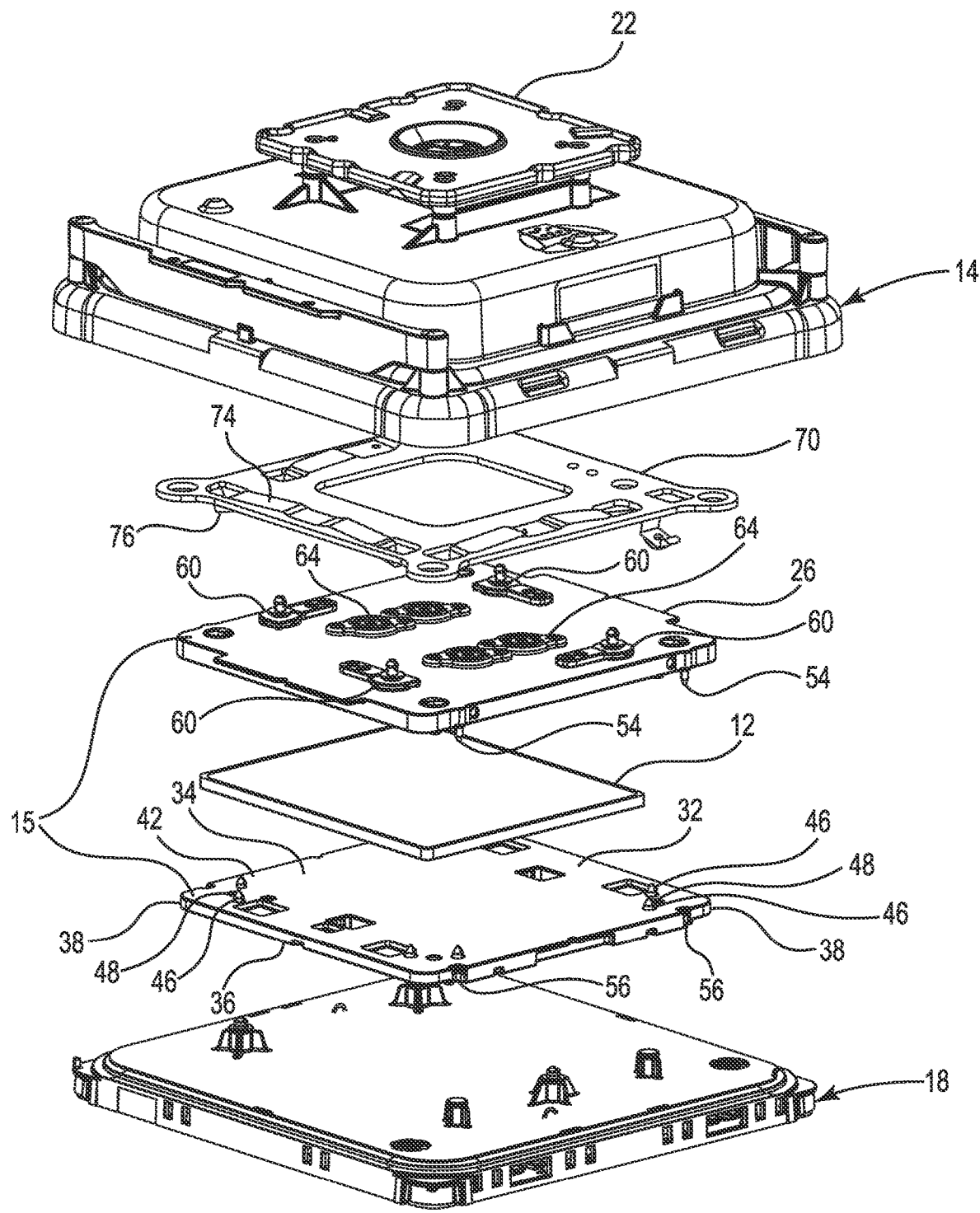
FIG. 3 is an exploded view of the reticle pod shown in FIG. 1.

FIGS. 1-3 show various views an exemplary reticle pod 10 for storing and transporting a reticle or mask 12. The reticle pod 10 may be sometimes referred to as a dual containment pod or an EUV pod, and may share some similar features with the reticle pod shown and described in U.S. Pat. No. 8,613,359 which is incorporated herein by reference in its entirety for all purposes. The term reticle may be used to refer to quartz blanks, photo-masks, EUV masks, and other masks that may be used in the semiconductor manufacturing industry that are susceptible to damage from particulates and other matters. In some cases, the reticle 12 may be substantially square in shape, and may be etched with the desired circuit pattern (not depicted). While the disclosed reticle pod 10 is described with reference to a generally square shaped reticle, it will be generally understood by those of skill in the art that reticles of other shapes such as for example, a rectangular, polygonal or circular shaped reticle, may be used.

As can be seen in FIGS. 1-3, the reticle pod 10 includes an outer pod 11 including an outer pod cover 14 that is configured to mate with an outer pod base 18 enclosing an inner pod 15 which in turn holds the reticle 12. The inner pod 15 includes an inner pod cover 26 configured to mate with an inner pod base 32 to form a sealed environment in which the reticle 12 is contained. The outer pod cover 14 can include one or more contact pads or protrusions provided on an inner surface that are configured to contact and apply a downward pressure to a corresponding reticle retainer provided in the cover of the inner pod. Additionally, in some cases, the outer pod cover 14 may include an optional robotic flange 22 which facilitates the automated transportation of the reticle pod 10 throughout a fabrication facility.

Referring now to FIG. 3, the inner pod base 32 has a size and shape generally conforming to the size and the shape of the reticle 12, and supports the reticle 12 when the reticle 12 is contained within the inner pod. The inner pod base 32 includes opposing first and second major parallel surfaces 34 and 36 and four radiused corners 38, and defines a continuous contact sealing surface 42 near the perimeter of first major surface 34. In one example, the entire first major surface 34 can be provided with a uniform and highly polished surface finish, but this is not required.

In some cases, as shown in FIG. 3, the inner pod base 32 can include a pair of reticle guides 46 and a reticle contact 48 located in each of the four corners 38 of the base 32. Such reticle guides and reticle contacts are shown and described in greater detail in U.S. Pat. No. 8,613,359, which is incorporated herein by reference. The reticle guides 46 may be used to guide and align the reticle 12 when the reticle 12 is seated on the base 32. The reticle 12 may rest on and be supported by the reticle supports 48 located in each of the four corners 38 of the base 32. The reticle supports 48 may be in the form of a spherical balls or protrusions that extend away from the first major surface 34 of the base 32. In some embodiments, the reticle supports 48 may be located an equal distance between each of the reticle guides 46 of a pair of reticle guides 46. Additionally, the reticle supports 48 may be configured such that they suspend the reticle 12 at a predefined height above the major surface 34 of the inner pod base 32 creating a gap between the reticle and the surface 34 of the inner pod base. In some cases, the gap is dimensioned to define a diffusion layer or diffusion barrier between the reticle 12 and the base 32. The diffusion barrier inhibits particles from migrating into the gap.

The inner pod cover 26 is configured to mate with the inner pod base 32 to define a sealed environment. The inner pod cover 26 has a size and shape generally corresponding to the size and shape of the inner pod base 32. In some cases, the inner pod cover 26 may include a plurality of protrusions or pins 54 sized and configured to be received by a plurality of notches 56 defined in an edge of the base 32. The pins 54 and notches 56 cooperate together to guide and align the cover 26 over the base 32 and also to retain the cover 26 in position when the cover 26 is engaged with the base 32.

The inner pod cover 26 also incorporates one or more reticle retainers 60, which will be described in greater detail herein. The reticle retainers 60 help to reduce or prevent movement of the reticle that may generate particles. The reticle retainers are incorporated into the inner pod cover 26 such that when the inner pod cover 26 is closed and is contained within the outer pod, the reticle retainers constrain horizontal or side to side movement of the reticle in an X and Y planes and also movement in the Z-direction. The reticle retainers 60 engage the side and/or or edge of the reticle in response to a downward force applied to the retainer in the Z-direction by a corresponding structure provided on the inner surface of the outer pod cover. In many embodiments, the inner pod cover 26 includes at least two reticle retainers 60. For example, in one embodiment, the inner pod cover 26 includes four reticle retainers 60. The number and location of the reticle retainers 60 may vary depending upon the size of the overall pod 10 and the load to be applied to the reticle 12 contained within the inner pod.

In addition to the reticle retainers 60, the inner pod cover 26 can include one or more filters 64 including a filter media contained therein for maintaining and controlling the microenvironment within the inner pod when the inner pod cover 26 is engaged with the inner pod base 32.

Figure 4:
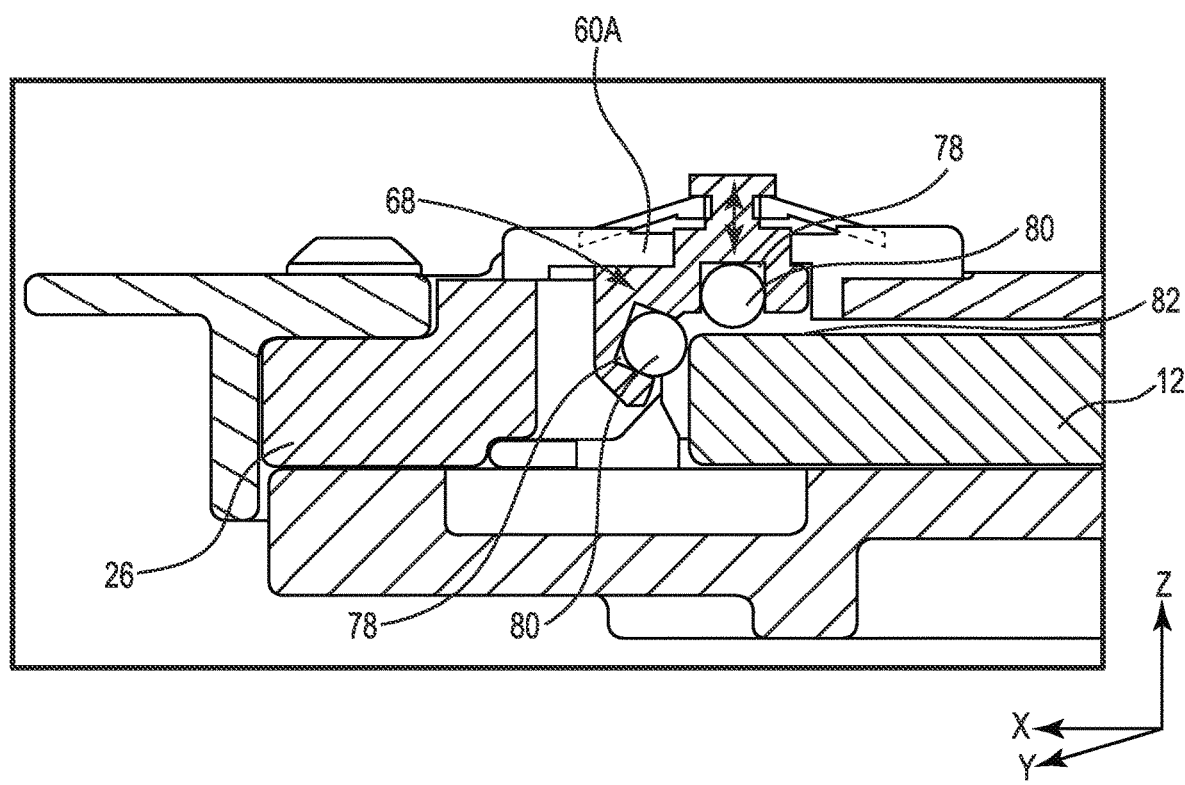
FIG. 4 is close-up, cross-sectional view of an inner pod including a reticle retainer in accordance with an embodiment of the disclosure.

FIG. 4 is a close up, cross-section view of a reticle retainer 60 according to an embodiment of the disclosure. In some cases, up to four such reticle retainers 60 can be located at different regions of the pod. The reticle retainer 60A includes a pin 68 extending through a bore 72 provided in the cover 26. The pin 68 can be attached to a resilient member 76 which is accessible on the outer surface of the cover 26. The resilient member 76 can be an elastomeric disk that is configured to bias the pin 68 in a retracted position. In the retracted position, the pin 68 is positioned upwards and away from the reticle 12 in the absence of a downward force applied to the pin 68 in the Z-direction. The disk forming the resilient member 76 may form a seal between the pin 68 and the bore 72 to prevent particulate matter from entering the inner pod.

The pin 68 includes two recesses 78. A spherical member or ball 80a, 80b is received in each of the recesses 78. The spherical members or balls 80a, 80b can be formed from a metal, metal alloy, ceramic or polymeric material. A first ball 80a can be positioned at an angle relative to the second ball 80b such when the reticle retainer 60A engages the reticle 12, the first ball 80a is in contact with an upper surface 82 of the reticle 12 of the reticle and the second ball 80b is in contact with a side surface 84 of the reticle 12. The reticle retainer 60A engages the reticle 12 in response to the application of a downward force provided by a corresponding structure provided on the inner surface of the outer pod cover. Contacting the upper surface 82 of the reticle 12 while at the same time contacting the side surface 84 of the reticle, constrains the reticle 12 at its edge. Because the reticle retainer 60A engages an edge 84 of the reticle 12, side to side or horizontal movement in the X and Y planes can be prevented or reduced. In addition, the applied load in the Z direction can be reduced.

Figure 5:
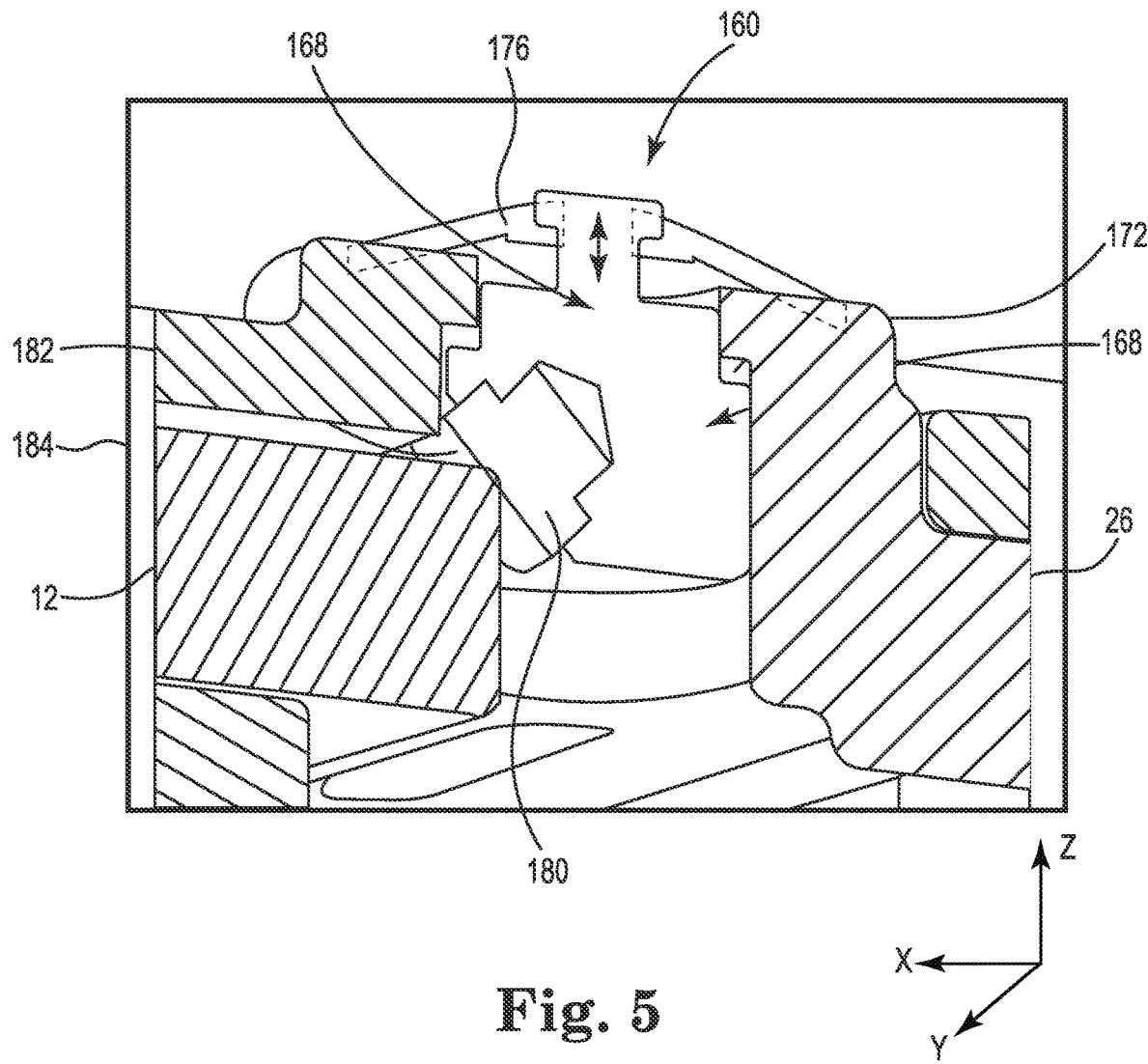
FIG. 5 is close-up, cross sectional view of an inner pod including a reticle retainer in accordance with another embodiment of the disclosure.

FIG. 5 a close up, cross-sectional view of another reticle retainer 160. In some cases, up to four such reticle retainers 160 can be located at different regions of the pod to provide up to four different points of contact. Similar to the embodiment discussed herein with reference to FIG. 4, the reticle retainer 160 includes a block or pin 168 extending through a bore 172 provided in the cover 26. The pin 168 can be attached to a resilient member 176 which is accessible on the outer surface of the cover 26. The resilient member 176 can be an elastomeric disk that is configured to bias the pin 168 in a retracted position. In the retracted position, the pin 168 is positioned upwards and away from the reticle 12. The disk forming the resilient member 176 may form a seal between the pin 168 and the bore 172 to prevent particulate matter from entering the inner pod.

A reticle contact member 180 is coupled to the pin 168. The reticle contact member 180 can be formed from stainless steel or TORLON and has an angled contact surface 182. In some cases, the edge 184 of the reticle 12 can be chamfered or beveled. The angled contact surface 182 of the contact member 180 is configured to contact and constrain an edge 184 of the reticle 12 when a downward force is applied to the pin 168 to move the pin in the Z-direction. The reticle retainer 160 engages the reticle 12 in response to the application of a downward force provided by a corresponding structure provided on the inner surface of the outer pod cover. Because the reticle retainer 160 engages an edge 184 of the reticle 12, side to side or horizontal movement in the X and Y planes can be prevented or reduced. In addition, the applied load in the Z direction can be reduced.

Figure 6A:
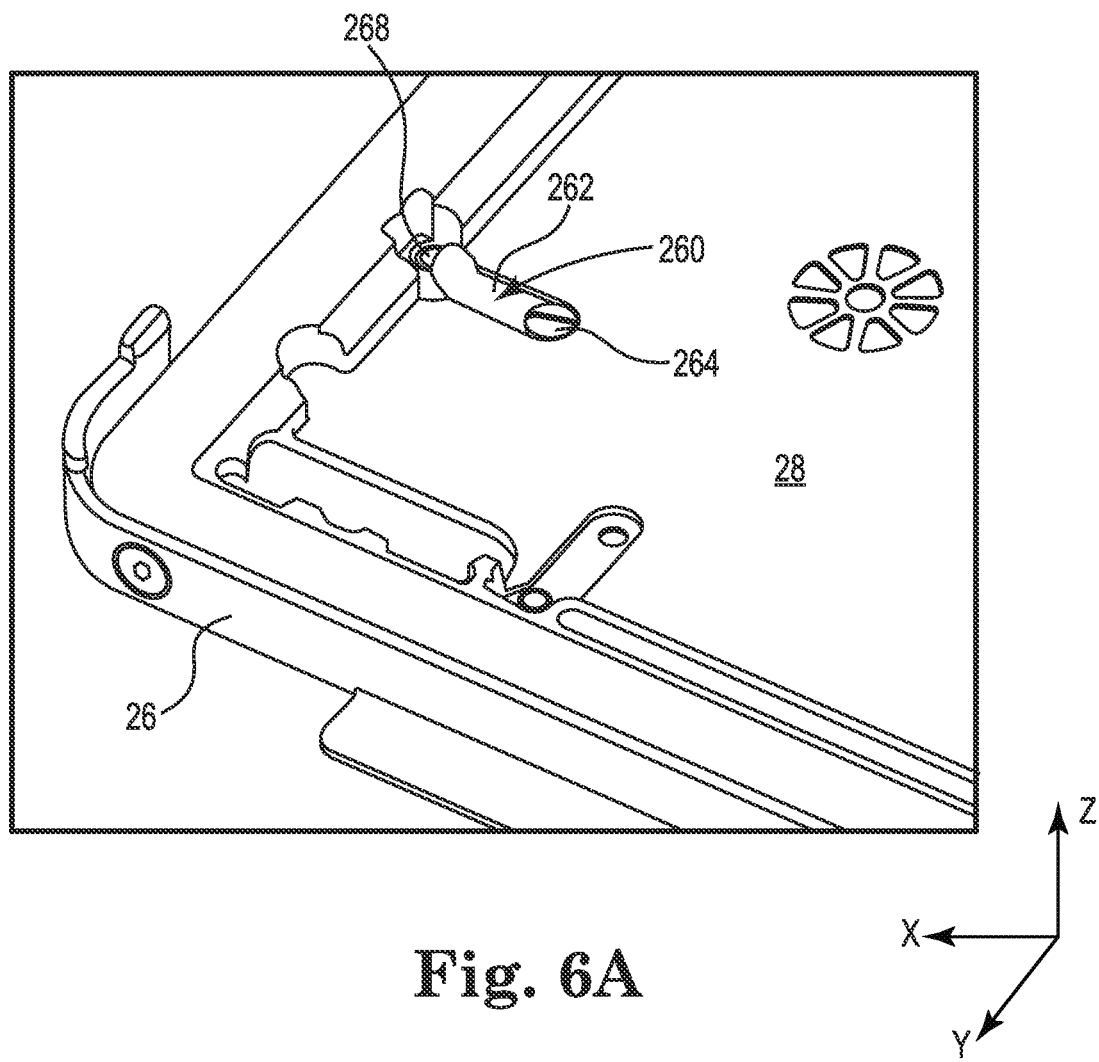
FIG. 6A is a close-up view of an inner pod including another reticle retainer provided on an inner surface of an inner pod cover in accordance with another embodiment of the disclosure.
Figure 6B:
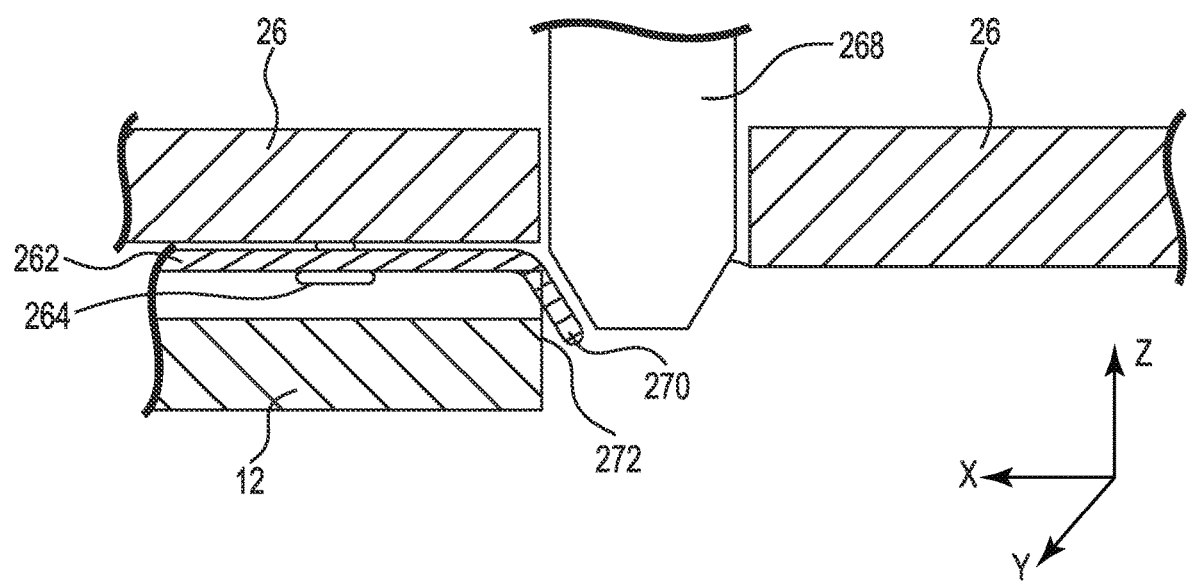
FIG. 6B is a schematic, cross-sectional view of the reticle retainer shown in FIG. 6A.

FIG. 6A is a close-up view of another reticle retainer 260 provided on an inner surface 28 of an inner pod cover 26 in accordance with another embodiment of the disclosure. In some cases, up to four such reticle retainers 260 can be located at different regions of the pod to provide up to four different points of contact. FIG. 6B is a schematic, cross-sectional view of the reticle retainer 260 shown in FIG. 6A. As shown in FIGS. 6A and 6B, the reticle retainer 260 includes a spring flexure or spring arm 262. The spring arm 262 is secured to the inner surface of the cover 26 using a screw 264 or other fastener. The spring arm 262 is configured to flex downward in a Z-direction when contacted by the pin 268. The spring arm 262 is configured to flex downward from a relaxed state in which no force is applied to a second state in which a downward force is applied, placing the spring arm 262 under some tension. The spring arm 262 is biased to its relaxed state and moves only when a downward force is applied to it by the pin 268. The spring arm 262 can be made of stainless steel, titanium, titanium alloy, NITINOL which has shape memory properties, and selected elastomeric polymers.

The pin 268 is similar to the pins 68 and 168 described herein. The pin 268 is positioned upwards and away from the reticle 12 in the absence of a downward force applied to the pin 268 in the Z-direction. A downward force can be applied to the pin 268 by a corresponding structure provided on the inner surface of the outer pod cover. In operation, the pin 268 contacts a distal end 270 of the spring arm 262, causing the spring arm 262 to move from its relaxed state to a second state in which the spring arm 262 contacts an edge 272 of the reticle 12. In some cases, the edge 272 of the reticle 12 can be chamfered or beveled. Because the reticle retainer 260 engages an edge 272 of the reticle 12, side to side or horizontal movement in the X and Y planes can be prevented or reduced. In some cases, separate reticle restraints may be provided on the inner surface of the top cover 26 to constrain vertical movement of the reticle in the Z direction. However, because the reticle retainer 260 restricts lateral movement in the X and Y direction, the load applied in the Z direction can be reduced.

FIG. 7 shows a schematic view of an embodiment in which the reticle retainer(s) 360 are coupled to a base 362 of an inner pod as described herein. In some cases, up to four such reticle retainers 360 can be located at different regions of the pod. FIG. 7 shows a first reticle retainer 360a in first position the first reticle retainer 360a is not in contact with a side of the reticle. Additionally, FIG. 7 shows a second reticle retainer 360b in a second position in which the second reticle retainer 360b contacts a side 372 of the reticle 12. Similar to the embodiment described with reference to FIGS. 6A and 6B, each of the reticle retainers 360a, 360b include a spring flexure or spring arm 364. The spring arms 364 can be secured to the inner surface of the base 362 using a screw 366 or other fastener. The spring arms 364 are configured to flex downward in a Z-direction when contacted by a pin or other structure secured to the inner pod cover as discussed herein. The spring arm 364 is configured to flex downward from a relaxed state in which no force is applied to a second state in which a second state is applied, placing the spring arm 364 under some tension. The spring arm 364 is biased to its relaxed state and moves only when a downward force is applied to it by a pin or other structure. The spring arm 364 can be made of stainless steel, titanium, titanium alloy, NITINOL which has shape memory properties, and selected elastomeric polymers. In some cases, separate reticle restraints may be provided on the inner surface of the top cover 26 to constrain vertical movement of the reticle in the Z direction. However, because the reticle retainer 360 restricts lateral movement in the X and Y directions, the load applied in the Z direction can be reduced.

Figure 8:
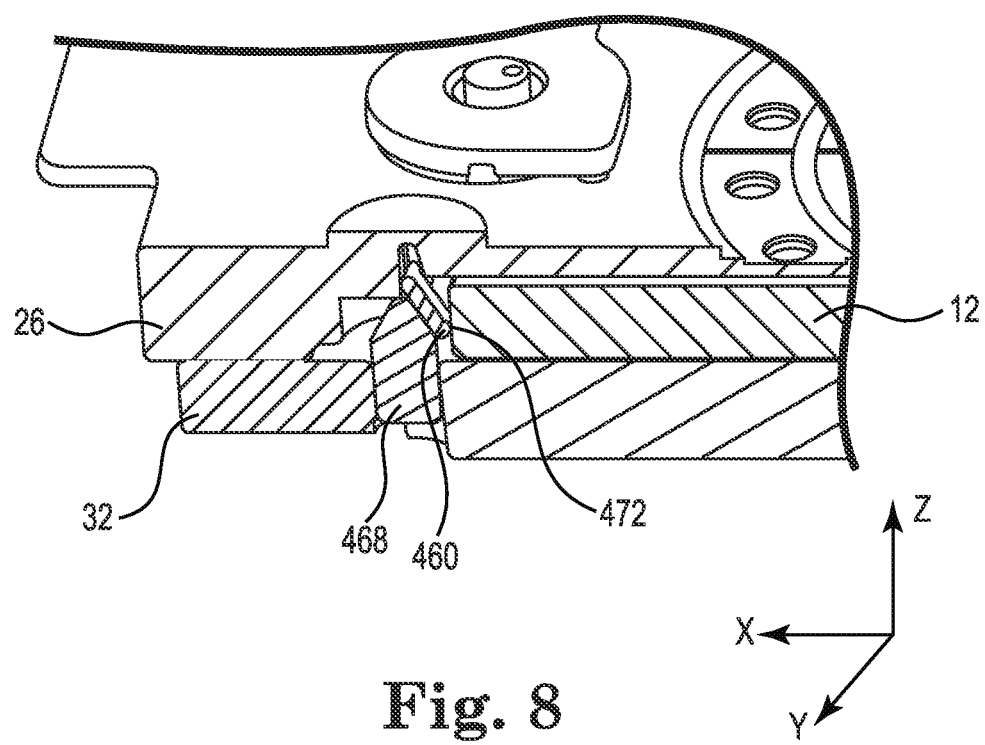
FIG. 8 is a schematic, cross-sectional view of an inner pod showing another reticle retainer in accordance with yet another embodiment of the disclosure.

FIG. 8 shows yet another reticle retainer 460. In some cases, up to four such reticle retainers 460 can be located at different regions of the pod to provide up to four different points of contact. As shown in FIG. 8, when the cover 26 is seated on the base 32, a stationery retaining pin or block 468 that contacts the reticle retainer 460 to move the reticle retainer into contact with a side wall 472 of the reticle 12. The reticle retainer 460 is coupled to the cover 26 and is configured to pivot from a first position in which there is no to contact with the reticle to a second position in which the retainer 460 contacts the reticle 12 from the side as shown in FIG. 8. In some cases, separate reticle restraints provided on the inner surface of the top cover 26 may be provided to constrain vertical movement of the reticle in the Z direction. However, because the reticle retainer 460 restricts lateral movement in the X and Y directions, the load applied in the Z direction can be reduced.

Figure 9A:
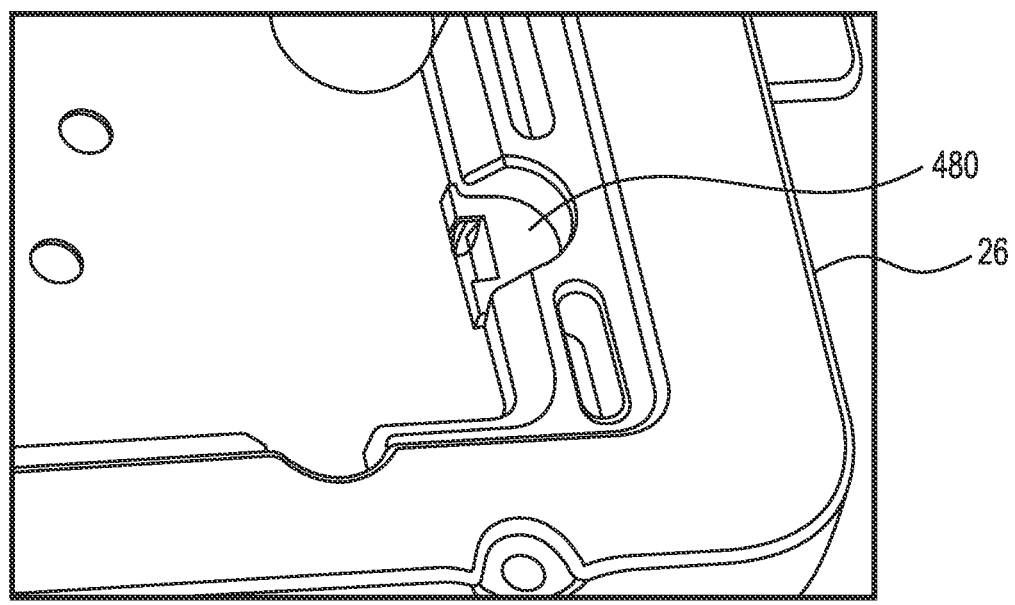
FIG. 9A shows a schematic view a portion of a bottom plate having a socket configured to receive a link.
Figure 9B:
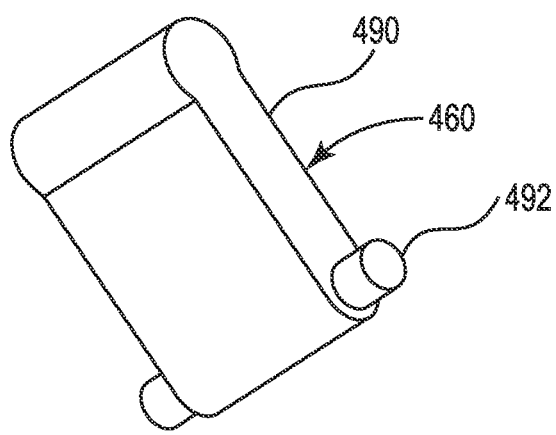
FIG. 9B shows a schematic view of a link configured to be received within the socket shown in FIG. 9A.

FIG. 9A shows a partial view of the inside of the inner pod cover 26. The inner pod 26 includes a recess or socket 482 for receiving the reticle retainer 460. As shown in FIG. 9B, the reticle retainer 460 includes a body 490 and a pivot arm 492. The pivot arm 492 is configured to be received in the grooves defined within the socket 482 such that the body 490 is capable of pivoting from a first position to a second position along a pivot axis defined by the pivot arm 492. In some cases, the reticle retainer 460 relies on gravity to stay in the first position. The reticle retainer is configured to move from the first position to the second position upon contact by the pin 468. In other cases, the reticle retainer 460 is spring loaded and is biased to a first position. In either embodiment, contact with the pin 468 causes the reticle retainer 460 to move from its first position to a second position where it contacts a sidewall 472 of the reticle.

Figure 10A:
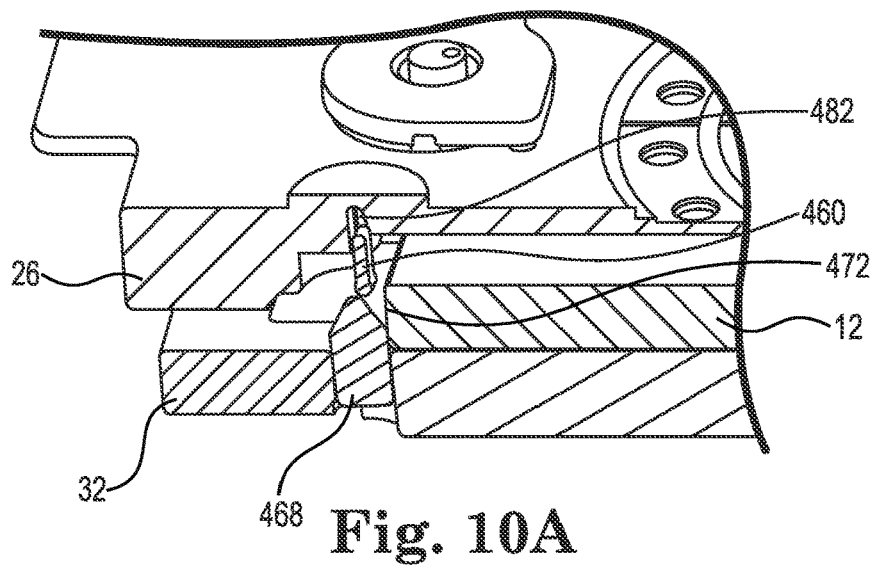
FIGS. 10A-10D show the reticle retainer of FIG. 8 in operation.
Figure 10B:
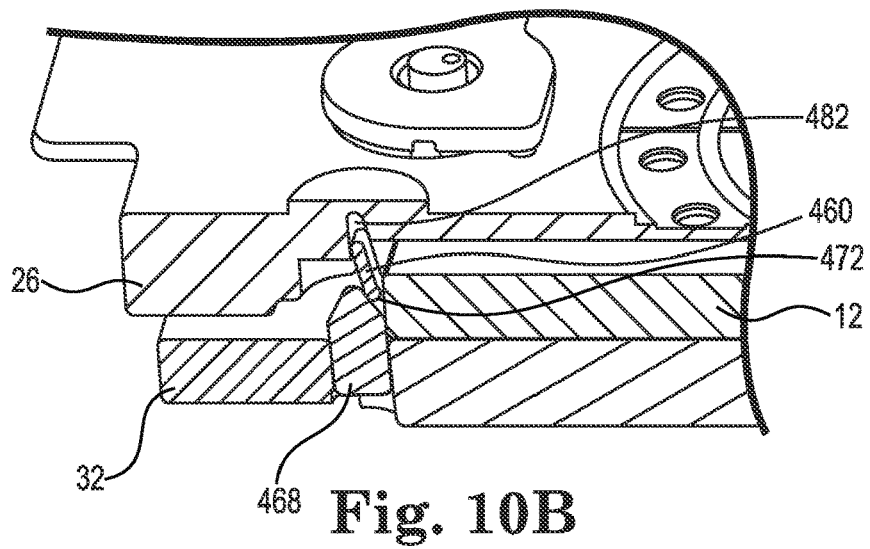
Figure 10C:
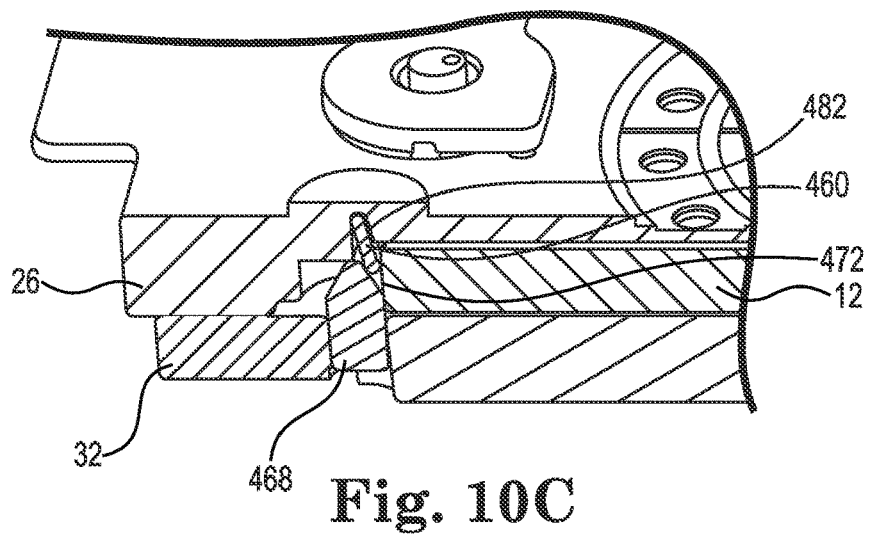
Figure 10D:
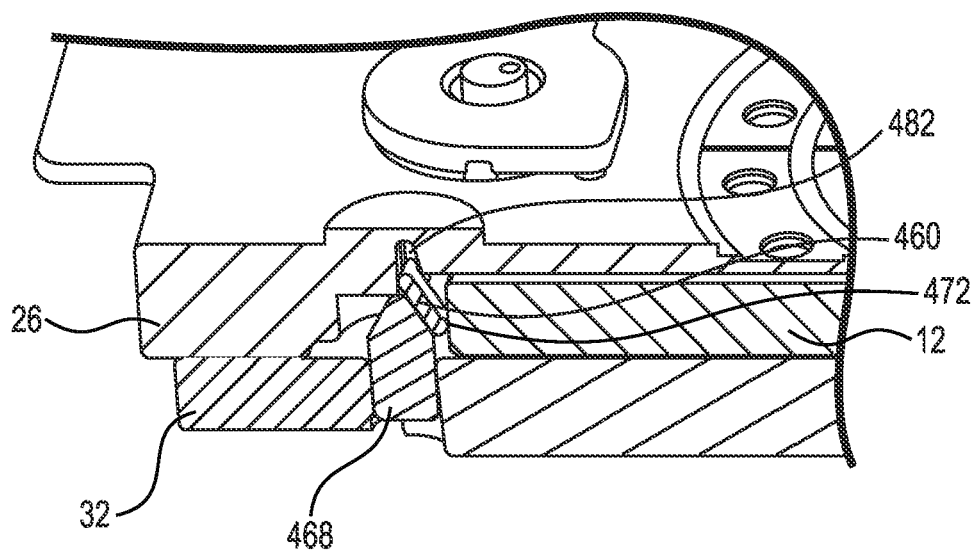

FIGS. 10A-10D show the reticle retainer 460 in operation. As the cover 26 is brought into contact with the base 32, the pin 468 begins to contact an edge of the retainer 460, as shown in FIG. 10A. Upon further contact by the pin 468, the reticle retainer 460 begins to contact a side wall 472 of the reticle 12 and minimizes the gap between the reticle 12 and the pin 468. As shown in FIG. 10C, at a minim gap distance defined between the pin 468 and the reticle 12, the reticle retainer 460 can be received in a slot defined in the socket 482. At a maximum distance between the pin 468 and the reticle 12, as shown in FIG. 10D, the reticle retainer 460 is not received in the slot; however, contact is maintained between the retainer 460 and the side wall 472 of the reticle.

Figure 11:
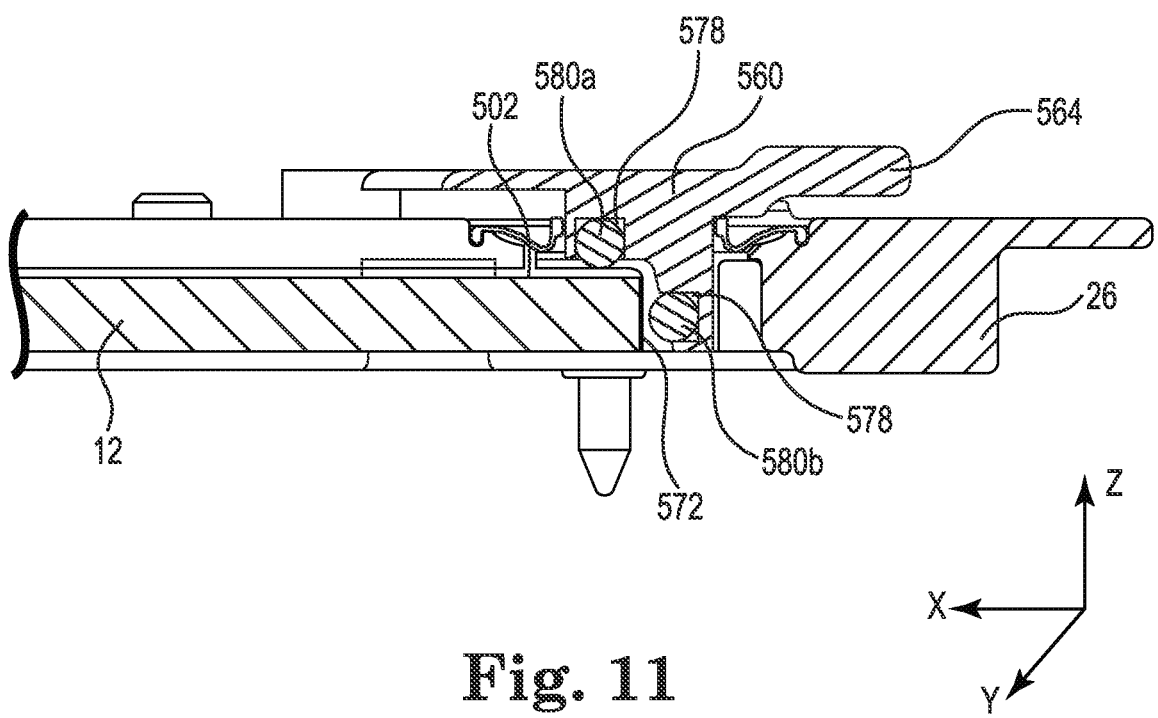
FIG. 11 is a schematic, cross-sectional view of an inner pod showing still another reticle retainer in accordance with an embodiment of the disclosure.
Figure 12A:
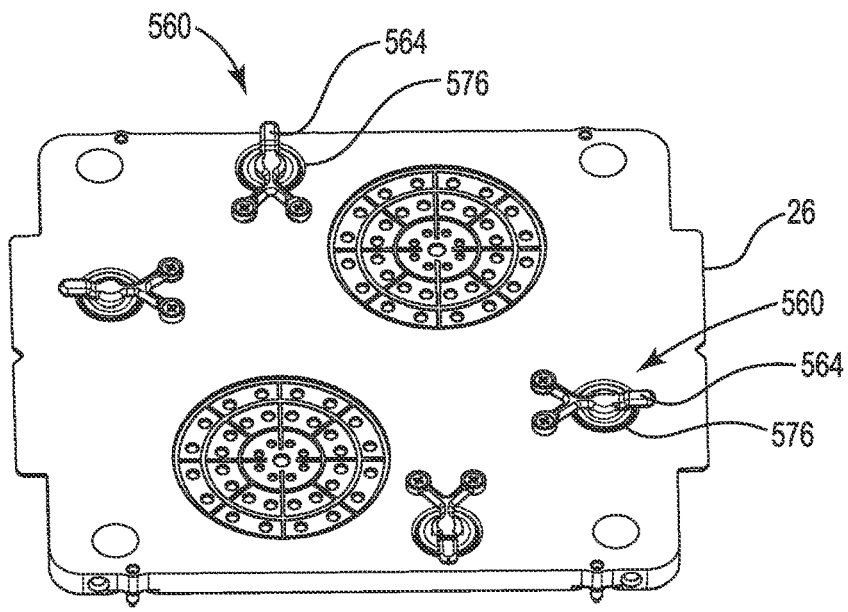
FIG. 12A shows a schematic view of an inner pod cover according to an embodiment of the disclosure.
Figure 12B:
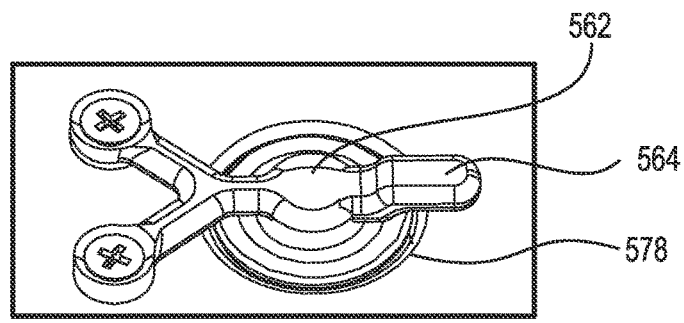
FIG. 12B is a close-up schematic view of a top of a reticle retainer according to an embodiment of the disclosure.
Figure 12C:
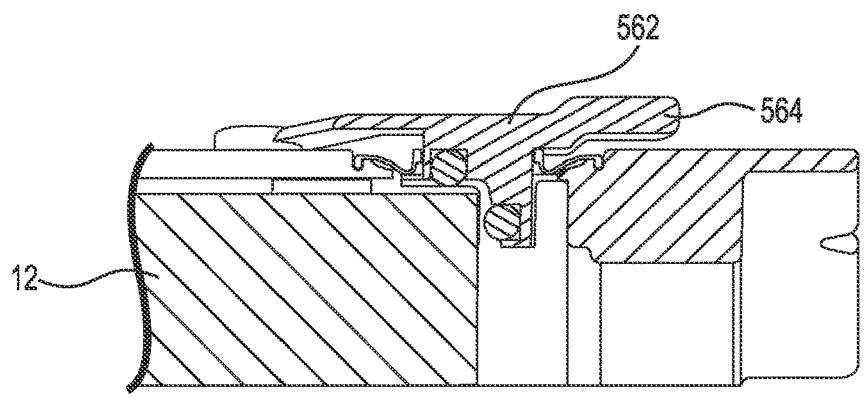
FIG. 12C is a schematic, partial cross-sectional view of a reticle retainer according to an embodiment of the disclosure.

FIGS. 11-12C show various views of yet another embodiment of a reticle retainer 560. In some cases, up to four such reticle retainers 560 can be located at different regions of the pod to provide up to four different points of contact. As best seen in FIG. 11, the reticle retainer 560 is configured to contact a top surface 502 and a side wall 572 of a reticle 12. Because the reticle retainer 560 contacts the side wall 572 of the reticle 12, the load applied to the top surface 502 can be reduced, and movement of the reticle is constrained in the X, Y, and Z directions.

As shown in FIG. 11, the reticle retainer 560 includes a body 562, an arm 564 extending away from the body, and a resilient member 576, such as diaphragm. In some cases, both the arm 564 and the resilient member 576 are accessible on the outer surface of the cover 26. In this embodiment, the reticle retainer body 562 is biased in a retracted position by the spring force of the arm 564. Application of a downward force to the arm 564, causes the body 562 to move in the Z-direction.

The reticle retainer body 562 includes two recesses 578. A reticle contact member or ball 580a, 580b is received in each of the recesses 578. The reticle contact members or balls 580a, 580b can be formed from a metal, meal alloy, ceramic or polymeric material. A first ball 580a can be positioned at an angle relative to the second ball 580b such when the reticle retainer 560 engages the reticle 12, the first ball 580a is in contact with an upper surface 502 of the reticle 12 of the reticle and the second ball 580b is in contact with a side wall 572 of the reticle 12. The reticle retainer 560 engages the reticle 12 in response to the application of a downward force provided by a corresponding structure provided on the inner surface of the outer pod cover.

Application of a downward force to the arm 564 causes the first reticle contact member 580a to contact the top surface 502 of the reticle 12 followed by the contact the body 562 to pivoting slightly inward toward the reticle 12 to bring the second contact member 580b into contact with the sidewall 572 of the reticle 12. Contact at the top surface 502 and the sidewall 572 of the reticle 12 constrains movement of the reticle 12 in the X, Y and Z directions.

Figure 13:
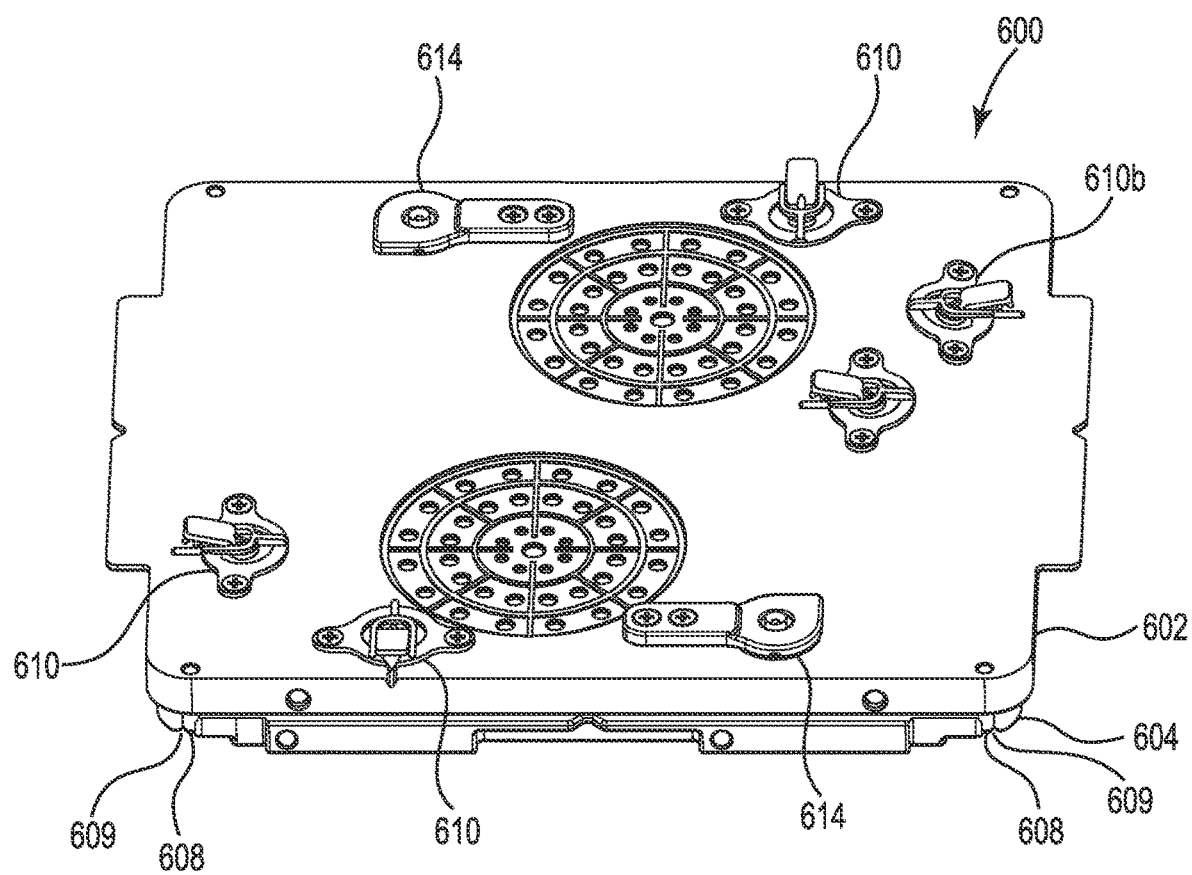
FIG. 13 is a perspective view of an inner pod according to yet another embodiment of the disclosure.

FIG. 13 shows an inner pod 600. The inner pod 600 includes an inner pod cover 602 configured to mate with the inner pod base 604 to define a sealed environment. A reticle can be contained within the sealed environment. The inner pod cover 602 has a size and shape generally corresponding to the size and shape of the inner pod base 604. In some cases, the inner pod cover 602 may include a plurality of protrusions or pins 608 sized and configured to be received by a plurality of corresponding recesses or notches 609 defined in an edge of the base 604. The pins 608 and notches 609 cooperate together to guide and align the cover 602 over the base 604, and also to retain the cover 602 in position when the cover 602 is engaged with the base 604.

The inner pod cover 602 also incorporates one or more sets of reticle retainers 610 and 614. The reticle retainers 610 and 614 help to reduce or prevent movement of the reticle that may generate particles. The sets of reticle retainers 610 and 614 are incorporated into the inner pod cover 602 such that when the inner pod cover 602 is closed the reticle retainers collectively constrain horizontal or side to side movement of the reticle in the X and Y planes in addition to the Z-direction. The reticle retainers 610 engage the side and/or an edge of the reticle in response to a downward force applied to the retainer in the Z-direction by a corresponding structure provided on the inner surface of the outer pod cover. The reticle retainers 614 contact a top surface of the reticle retainer in response to a downward force applied by a corresponding structure provided on the inner surface of the outer pod cover. However, because reticle retainers 610 constrain the reticle from the side, the amount of force applied by reticle retainers 614 to the top surface of the reticle can be reduced. In addition, when the inner pod 600 is closed and is contained within an outer pod, the reticle retainer 614 contact a top surface of the reticle 12 prior to the side reticle retainers 610 contacting a side surface and/or an edge of the reticle 12. Providing initial contact with a top surface of the reticle 12 stabilizes the reticle and prevents it from shifting in the X and/or Y plane prior to being restrained by the side reticle retainers 610.

The number and location of the reticle retainers 610, 614 can vary depending upon the size of the overall pod and the load to be applied to the reticle contained within the inner pod. In some cases, it may be useful to combine reticle retainers configured to contact a top surface of the reticle with reticle retainers configured to contact a reticle from a side or an edge of the reticle. In other cases, the inner pod cover may include reticle retainers configured to contact a side or an edge of the reticle and may eliminate reticle retainers configured to contact a top surface of the reticle. In some embodiments, as shown in FIG. 13, the inner pod cover 602 can include two pairs of reticle retainers, each reticle retainer configured to contact the reticle from the side and at least one pair of reticle retainers wherein each reticle retainer is configured to contact a top surface of the reticle. Each pair of reticle retainers 610 configured for side contact are positioned on the inner pod cover 602 such that they work together to constrain a corner of the reticle from movement in the X and Y planes.

In addition to the reticle retainers 610 and 614, the inner pod cover 602 can include one or more filters including a filter media contained therein for maintaining and controlling the microenvironment within the inner pod when the inner pod cover 602 is engaged with the inner pod base 604.

Figure 14A:
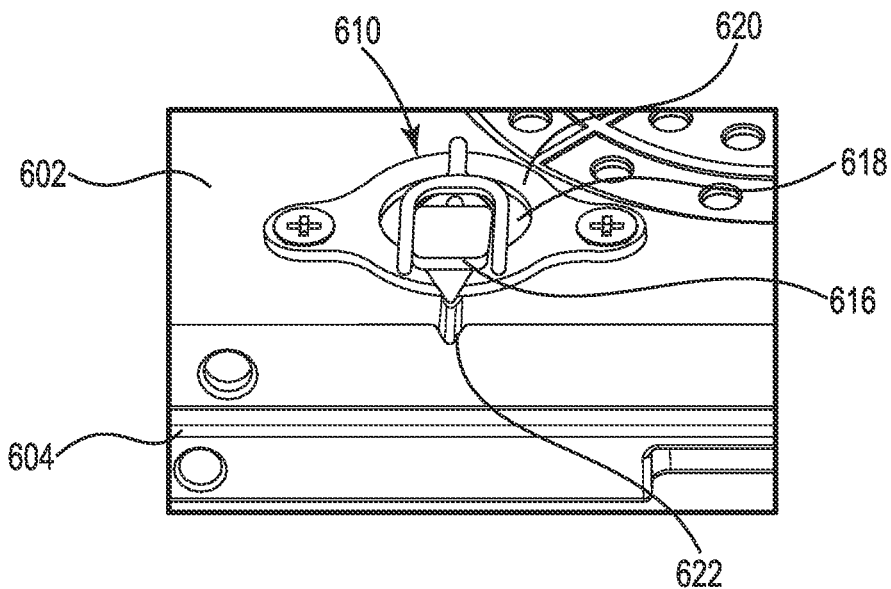
FIGS. 14A and 14B are close-up, perspective views of a top portion of a reticle retainer according to another embodiment of the disclosure.
Figure 14B:
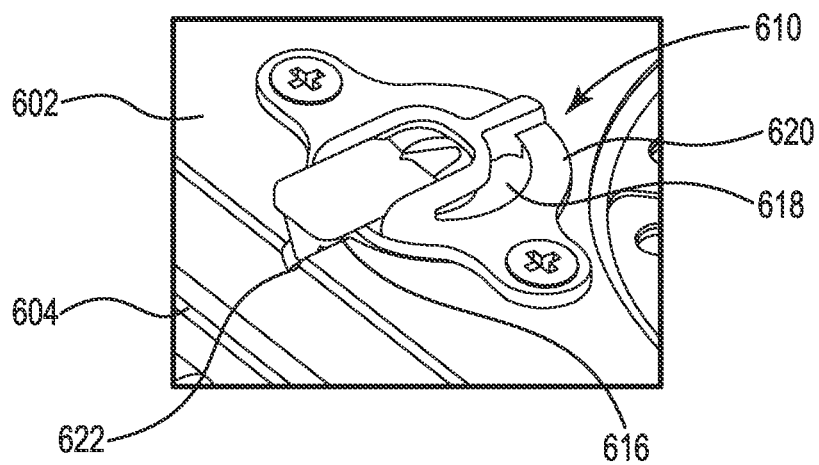

FIGS. 14A and 14B show different views of a portion of a reticle retainer 610, configured to restrain the reticle from a side of the reticle. As can be seen in FIGS. 14A and 14B, the reticle retainer 610 includes a reticle contact member 616, a resilient member 618 and a cap 620, all of which are accessible from outside the inner pod cover 602. The reticle contact member 616 and the resilient member 618 are retained in place by the cap 620 which is secured to the inner pod cover 602 by one or more fasters such as, for example, a pair of screws. The resilient member 618 can be an elastomeric disk or diaphragm configured to bias the reticle contact member 616 to a retracted or non-contact position. In addition, as discussed previously herein, the disk forming the resilient member 618 can act as a seal and may help to prevent particulate matter from entering the inner pod. In the retracted position, the reticle contact member 616 is positioned away from and out of contact with the reticle 12. Both the resilient member 618 and the reticle contact member 616 are configured to respond to the application of a downward force in the Z-direction permitting the reticle contact member 616 to move from a first, retracted position in which the reticle contact member 616 is not in contact with the reticle to a second position in which the reticle contact member 616 contacts a side of the reticle housed within the inner pod. In some cases, the inner pod cover 602 can also include one or more recesses 622 for receiving a portion of the reticle contact member 616. A portion of the reticle contact member 616 is received in the recess 622 upon application of a downward force in the Z-direction to the reticle contact member 616. The recess 622 provides a stabilizing force to the reticle contact member 616 to prevent the reticle contact member 616 from sliding in the X and Y-planes.

FIGS. 15A-15C show different views of a reticle contact member 616. The reticle contact member 616 can be a single unitary piece made from a polymer, polymer blend, metal or metal alloy. The reticle contact member 616 can be machined or injection molded depending upon the material from which it is made. In some cases, as seen, the reticle contact member 616 includes a laterally extending arm 626 including at least one downwardly extending finger 628. Additionally, the reticle contact member 616 includes a downwardly extending leg 630 having a smooth outwardly extending face 632 configured to contact a side of a reticle. Each of the fingers 628 are configured to be received in and apply a downward force to a corresponding recess 622 formed in the inner pod cover 602 for that purpose. In some cases, as shown FIGS. 15A-15C, each of the fingers 628 include an angled or beveled edge. The angled or beveled edge provided on each of the fingers 628 is designed to increase the amount of friction between the fingers 628 and the surfaces of the recess 622 such that the reticle contact member 616 is resistant to side to side movement in the X and Y planes. This interaction between the fingers 628 and the surfaces of the recess may reduce the likelihood of the leg 630 sliding away from the reticle. In some cases, as shown, the leg 630 can include a groove 634 for interacting with a retaining the resilient member 618.

Figure 16A:
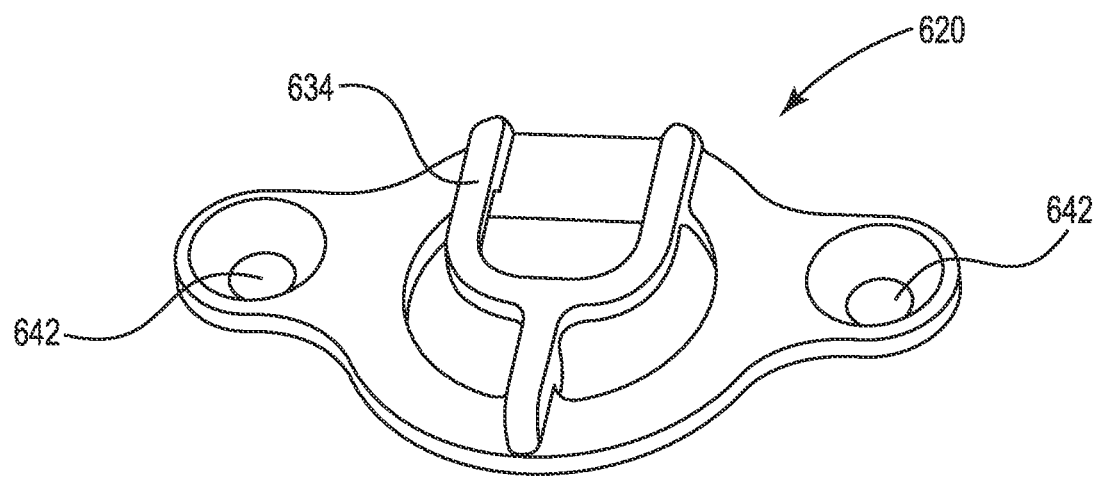
FIGS. 16A and 16B show top and bottom perspective views of a cap which forms a portion of the reticle retainer according to an embodiment of the disclosure.
Figure 16B:
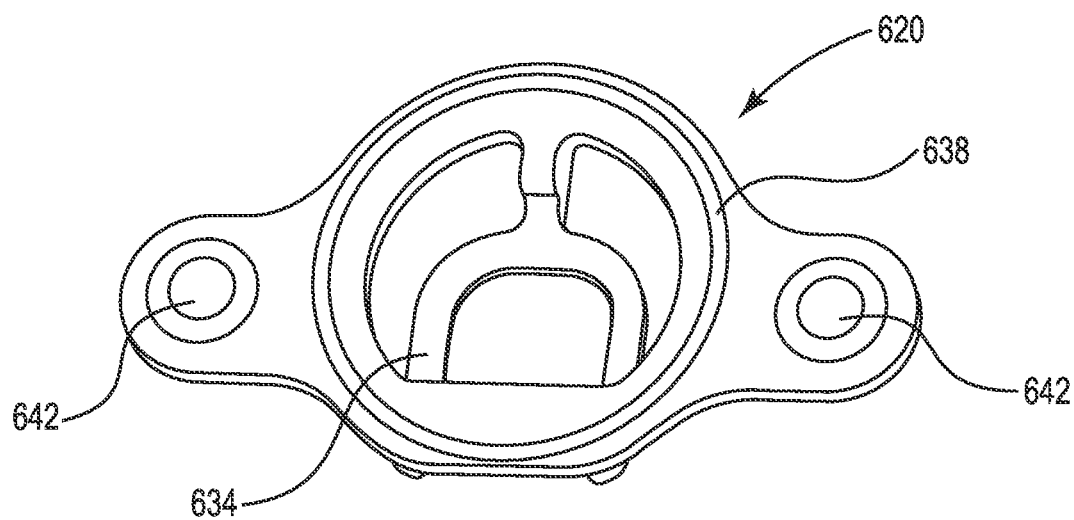

FIGS. 16A and 16B show top and bottom views of the cap 620. In use, the cap 620 is disposed over and in contact with the reticle contact member 616 and the resilient member 618. The cap 620 includes a bracket or cross-brace member 634 that contacts and retrains side to side movement of the reticle contact member 616 in the X and Y planes, as well as limits any potential upward and downward movement of the reticle contact member 616 in the Z-direction. In some cases, the bracket 634 has a Y shape or is wishbone shaped, although other configurations may be readily recognized by those of skill in the art. In some cases, the cap 620 can includes a circular ridge 638 that contacts and applies a pressure to the resilient member 618 and one or more apertures to receive one or more corresponding fasteners to secure the cap 620 to the inner pod cover 602.

Figure 17A:
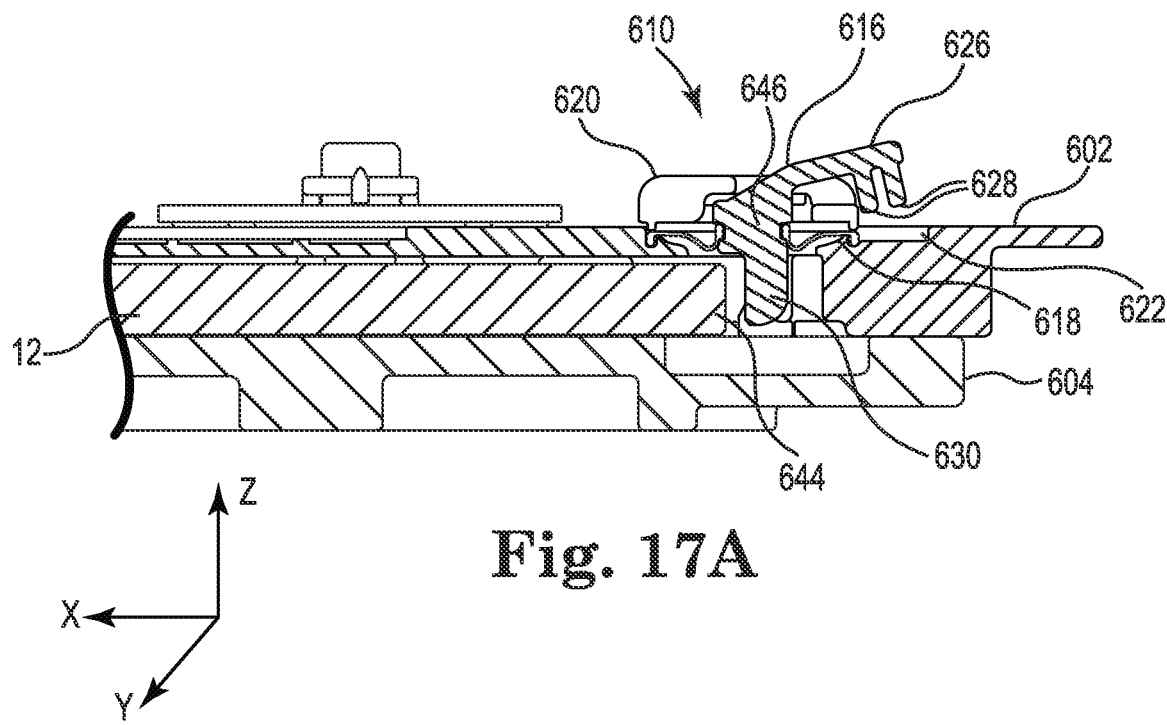
FIGS. 17A and 17B are partial, side cross-sectional views of the inner pod showing the reticle retainer in a first position and a second position.
Figure 17B:
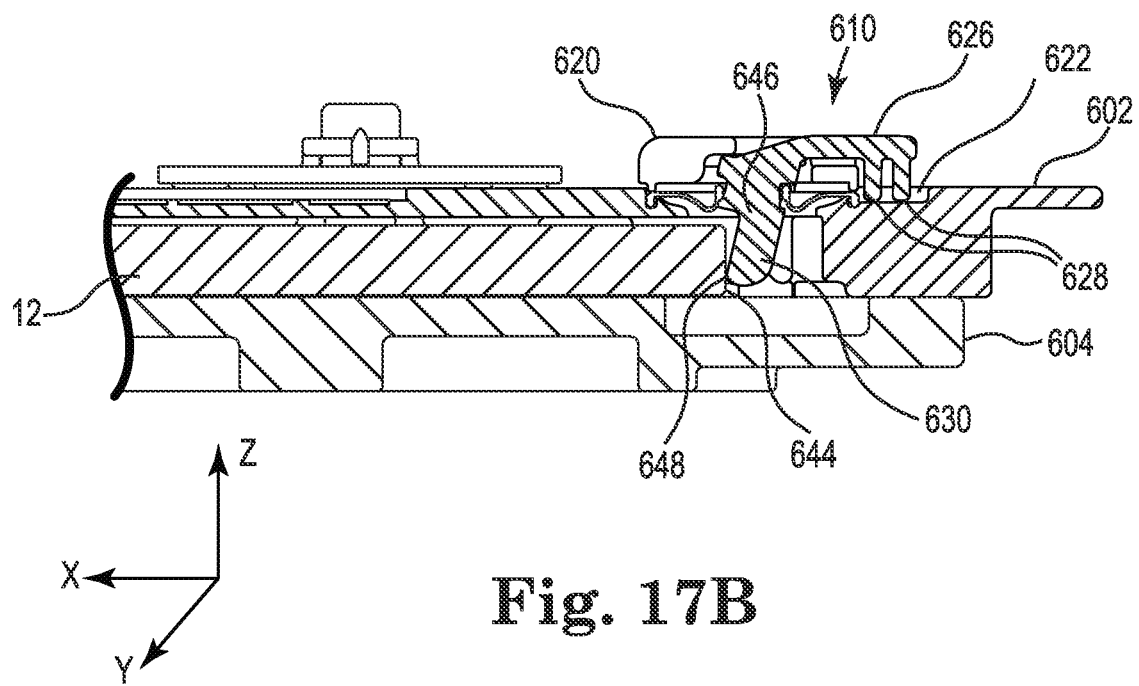

FIGS. 17A and 17B show cross-sectional views of the inner pod 600 including the reticle retainer 610. FIG. 17A shows the reticle retainer 610 in a first, non-contact position and FIG. 17B shows the reticle retainer 610 in a second, contact position in which the leg 630 of the reticle contact member 616 has been brought into contact with a side surface 644 of the reticle 12 upon application of a downward force in the Z-direction to the arm 626. Upon application of a downward force to the arm 626 of the reticle contact member 616, the reticle contact member 616 pivots or rotates about a first axis of rotation 646, causing the fingers 628 to move downward to be received in the recess 622 and also causing the leg 630 to pivot forward towards the side surface 644. Rotation about the first axis of rotation 646 ceases when the leg 630 contact the side surface of the reticle 644 as shown in FIG. 17B. A second axis of rotation 648 is created by the reticle 12 pushing back on the leg 630. However, the return action of the reticle 12 pushing back on the leg 630 action causes additional force to be placed on the fingers 628 received in the recess 622, further strengthening and stabilizing the point of contact between the reticle contact member 616 and the reticle 12. In addition, the axis of rotation 646 is flexible, and changes from rotation axis 646 to rotation axis 648. This shift or change in the rotation axis from the first axis of rotation 646 to the second axis of rotation 648 is provided by the resilient member 618. The resilient member 618 provides a sufficient amount of flexibility such that the first axis of rotation 646 can shift in the X plane when the leg 630 contacts the side surface 644 of the reticle 12 at the second rotational axis 648. In response to contact between the leg 630 and the side surface 644, the resilient member 618 flexes to help main side contact between the leg 630 and the reticle 12 preventing movement of the reticle 12 in the X and/or Y plane. Referring back to FIG. 13, constraining the reticle 12 in the X and Y planes by contacting the side surface 644 of the reticle 12 may reduce amount of the load need in the Z direction which may be applied by additional reticle retainers 614.

Figure 18:
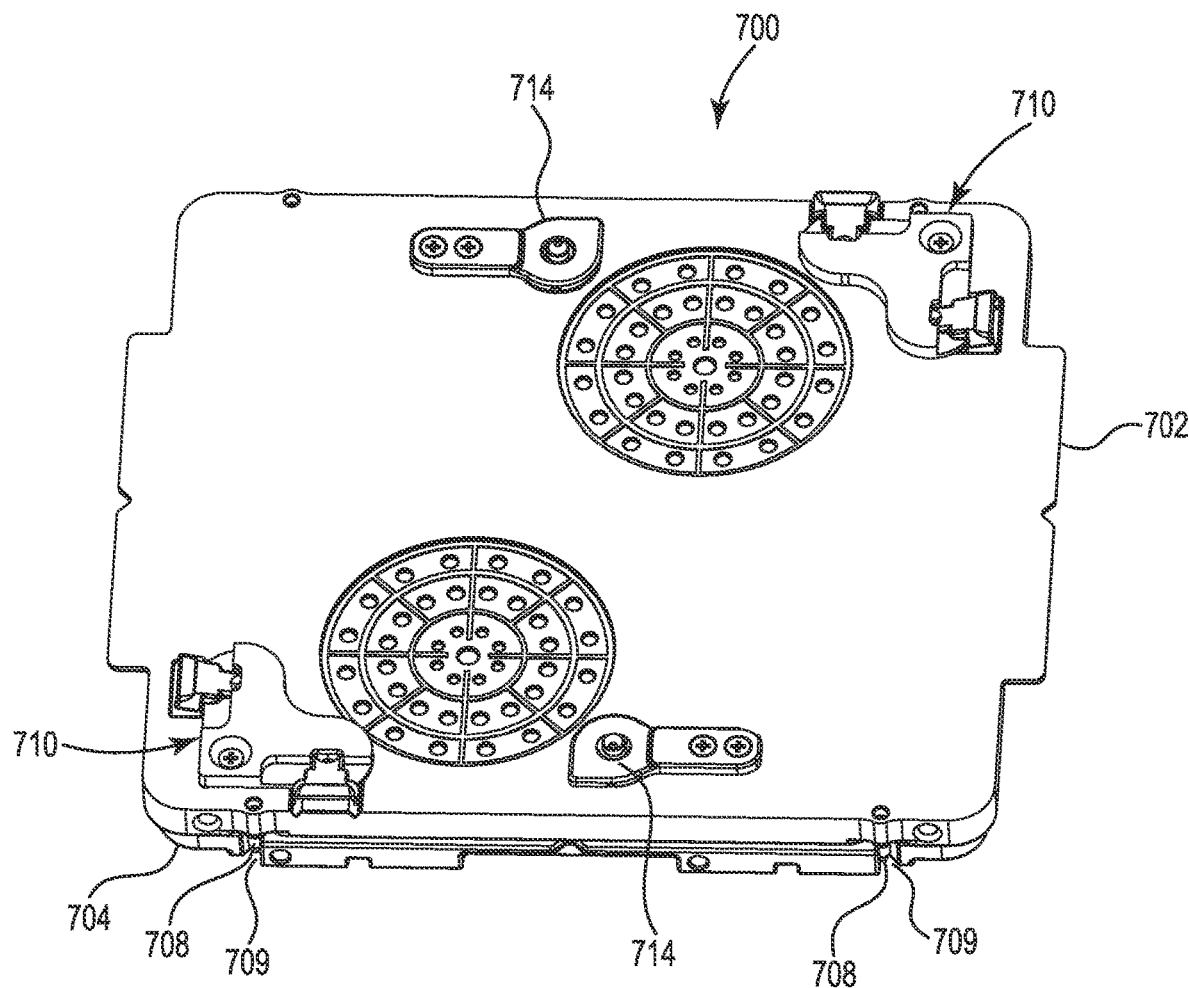
FIG. 18 is a perspective view of an inner pod in accordance with an embodiment of the disclosure.

FIG. 18 shows an inner pod 700 according to another embodiment of the disclosure. The inner pod 700 includes an inner pod cover 702 configured to mate with the inner pod base 704 to define a sealed environment. A reticle can be contained within the sealed environment. The inner pod cover 702 has a size and shape generally corresponding to the size and shape of the inner pod base 704. In some cases, the inner pod cover 702 may include a plurality of protrusions or pins 708 sized and configured to be received by a plurality of corresponding recesses or notches 709 defined in an edge of the base 704. The pins 708 and notches 709 cooperate together to guide and align the cover 702 over the base 704. Additionally, the pins 708 and notches 709 retain the cover 702 in position when the cover 702 is engaged with the base 704.

The inner pod cover 702 also incorporates one or more sets of reticle retainers 710 and 714. The reticle retainers 710 and 714 help to reduce or prevent movement of the reticle that may generate particles. The reticle retainers 710 and 714 are incorporated into the inner pod cover 702 such that when the inner pod cover 702 is closed the reticle retainers collectively constrain horizontal or side to side movement of the reticle in the X and Y planes in addition to the Z-direction. The reticle retainers 710 engage the side and/or or edge of the reticle in response to a downward force applied to the retainer in the Z-direction by a corresponding structure provided on the inner surface of the outer pod cover. The reticle retainers 714 contact a top surface of the reticle retainer in response to a downward force applied by a corresponding structure provided on the inner surface of the outer pod cover. However, because reticle retainers 710 constrain the reticle from the side, the amount of force applied by reticle retainers 714 to the top surface of the reticle can be reduced. In addition, when the inner pod 700 is closed and is contained within an outer pod, the reticle retainer 714 contact a top surface of the reticle 12 prior to the side reticle retainers 710 contacting a side surface and/or an edge of the reticle 12. Providing initial contact with a top surface of the reticle 12 stabilizes the reticle and prevents it from shifting in the X and/or Y plane prior to being restrained by the side reticle retainers 710.

The number and location of the reticle retainers 710, 714 can vary depending upon the size of the overall pod and the load to be applied to the reticle contained within the inner pod. In some cases, it may be useful to combine reticle retainers configured to contact a top surface of the reticle with reticle retainers configured to contact a reticle from a side or an edge of the reticle. In other cases, the inner pod cover 702 may include reticle retainers configured to contact a side or an edge of the reticle and may eliminate reticle retainers configured to contact a top surface of the reticle. In some embodiments, as shown in FIG. 18, the inner pod cover 702 can include two pairs of reticle retainers 710, each configured to contact the reticle from the side and at least one pair of reticle retainers 714 configured to contact a top surface of the reticle. In some cases, each pair of reticle retainers 710 configured for side contact are positioned on the inner pod cover 702 such that they work together to constrain a corner of the reticle from movement in the X and Y planes.

In addition to the reticle retainers 710 and 714, the inner pod cover 702 can include one or more filters including a filter media contained therein for maintaining and controlling the microenvironment within the inner pod when the inner pod cover 702 is engaged with the inner pod base 704.

Figure 19:
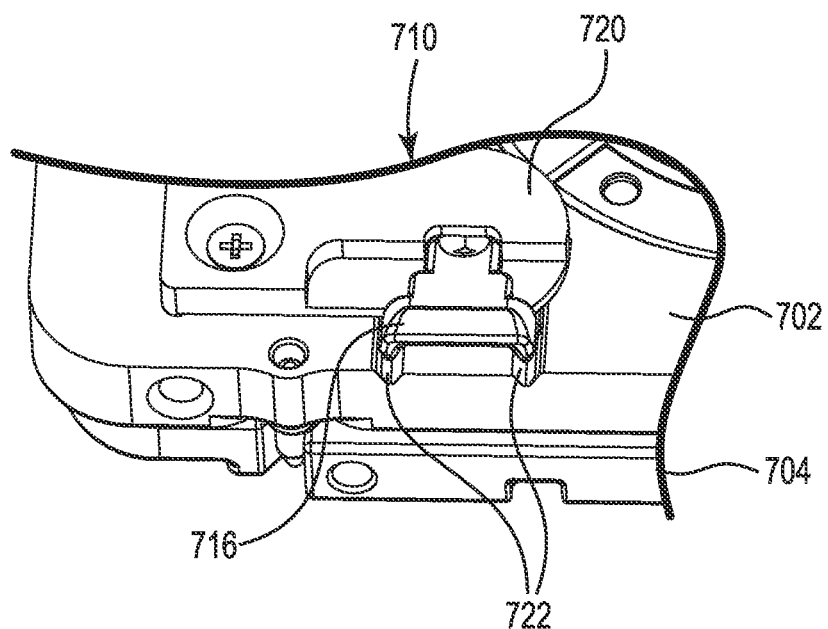
FIG. 19 is a close-up, schematic view of a portion of the reticle retainer in accordance with an embodiment of the disclosure.

FIG. 19 shows different views of a portion of a reticle retainer 710, configured to restrain the reticle from a side of the reticle. As can be seen in FIG. 19, the reticle retainer 710 includes a reticle contact member 716, a resilient member 718 (shown in FIGS. 23A and 23B) and a cap 720, all of which are accessible from outside the inner pod cover 702. The reticle contact member 716 and the resilient member 718 are retained in place by the cap 720 which is secured to the inner pod cover 702 by one or more fasters such as, for example, a screw. The resilient member 718 can be an elastomeric disk or diaphragm configured to bias the reticle contact member 716 to a retracted or non-contact position. In addition, as discussed previously herein, the disk forming the resilient member 718 can act as a seal and may help to prevent particulate matter from entering the inner pod. In the retracted position, the reticle contact member 716 is positioned away from and out of contact with the reticle. Both the resilient member 718 and the reticle contact member 716 are configured to respond to the application of a downward force in the Z-direction permitting the reticle contact member 716 to move from a first, retracted position in which the reticle contact member 716 is not in contact with the reticle to a second position in which the reticle contact member 716 contacts a side of the reticle housed within the inner pod. In some cases, the inner pod cover 702 can also include one or more recesses 722 for receiving a portion of the reticle contact member 716. A portion of the reticle contact member 716 is received in the recesses 722 upon application of a downward force in the Z-direction to the reticle contact member 716. The recesses 722 provides a stabilizing force to the reticle contact member 716 to prevent the reticle contact member 716 from sliding side to side the X and Y-planes.

Figure 20A:
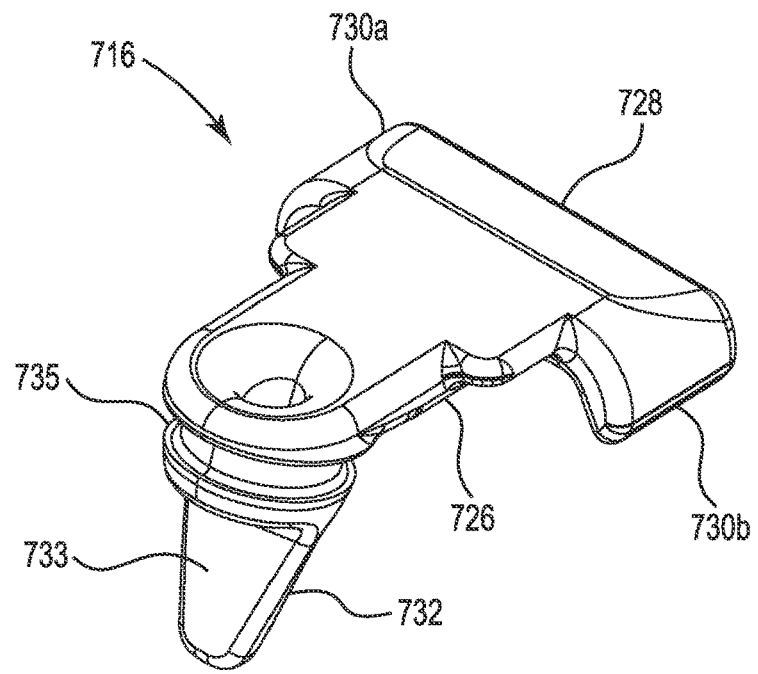
FIGS. 20A and 20B show different views of a reticle contact member in accordance with an embodiment of the disclosure.
Figure 20B:
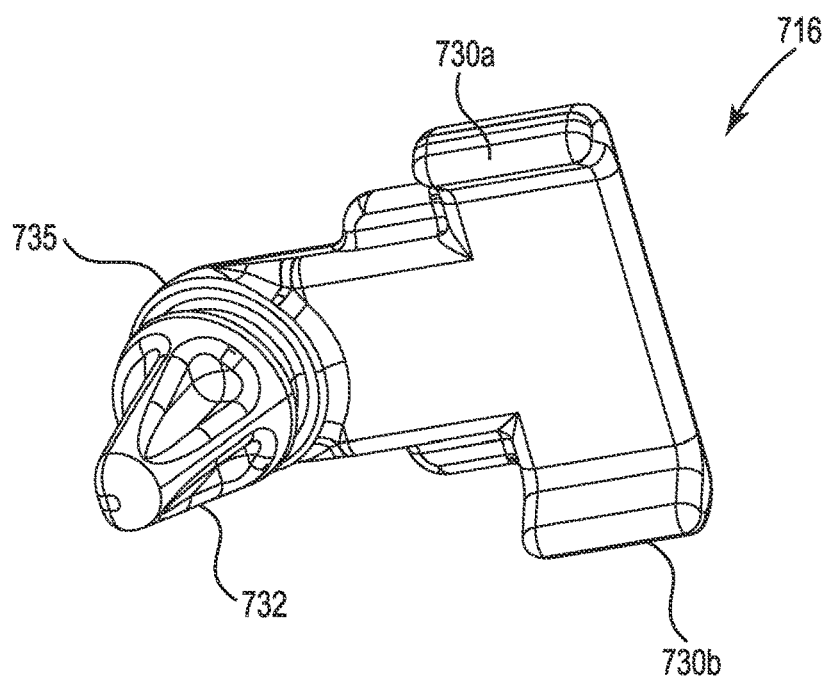

FIGS. 20A and 20B show different views of a reticle contact member 716. The reticle contact member 716 can be a single unitary piece made from a polymer, polymer blend, metal or metal alloy. The reticle contact member 716 can be machined or injection molded depending upon the material from which it is made. In some cases, as seen, the reticle contact member 716 includes a laterally extending arm 726 and a cross member 728 that forms a T-shape with the laterally extending arm 726. The cross member 728 includes a first downwardly extending shoulder 730a that is spaced apart from a second downwardly extending shoulder 730b. In some cases, the downwardly extending shoulders 730a, 730b extend along an entire width of the cross member 728, but this is not required. In other cases, the downwardly extending shoulders 730a, 730b can extend from twenty-five percent to seventy five percent of the width of the cross member 728. Additionally, the reticle contact member 716 includes a downwardly extending leg 732 having a smooth outwardly extending face 733 configured to contact a side of a reticle.

Each of the shoulders 730a, 730b are configured to be received in and apply a downward force to a corresponding recess 722 formed in the inner pod cover 702 for that purpose. In some cases, as shown FIGS. 20A and 20B, each of the shoulders 730a, 730b include an angled or beveled edge. The angled or beveled edge provided on each of the shoulders 730a, 730b is designed to increase the amount of friction between the shoulders 730a, 730b and the surfaces of the recesses 722 such that the reticle contact member 716 resists side to side movement in the X and Y planes. This interaction between the shoulders 730a, 730b and the surfaces of the recesses 722 may reduce the likelihood of the leg 732 sliding away from the reticle when in contact with the reticle. In some cases, as shown, the leg 732 can include a groove 735 for interacting with a retaining the resilient member 718.

Figure 21A:
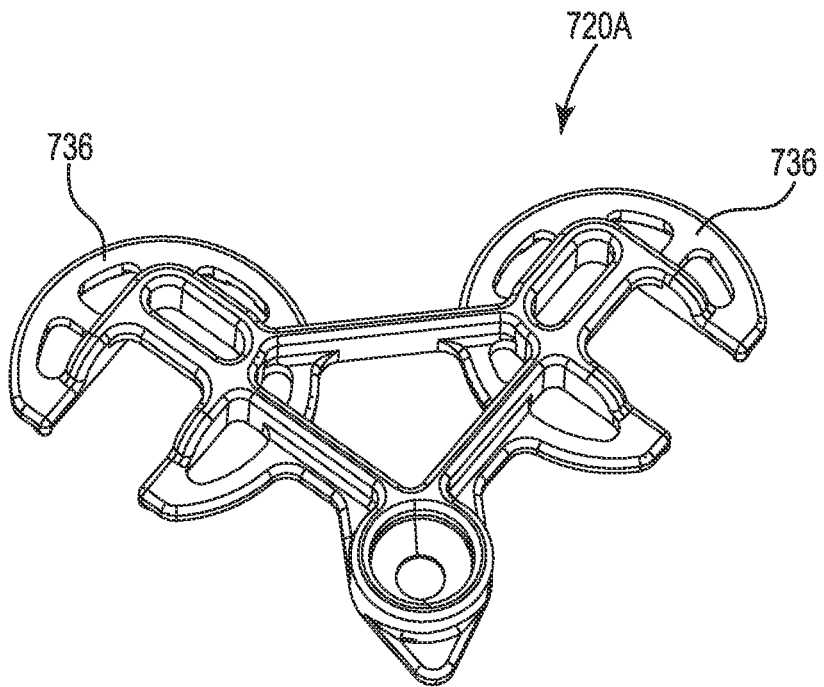
FIGS. 21A and 21B show top and bottom perspective views of a cap which forms a portion of the reticle retainer in accordance with an embodiment of the disclosure.
Figure 21B:
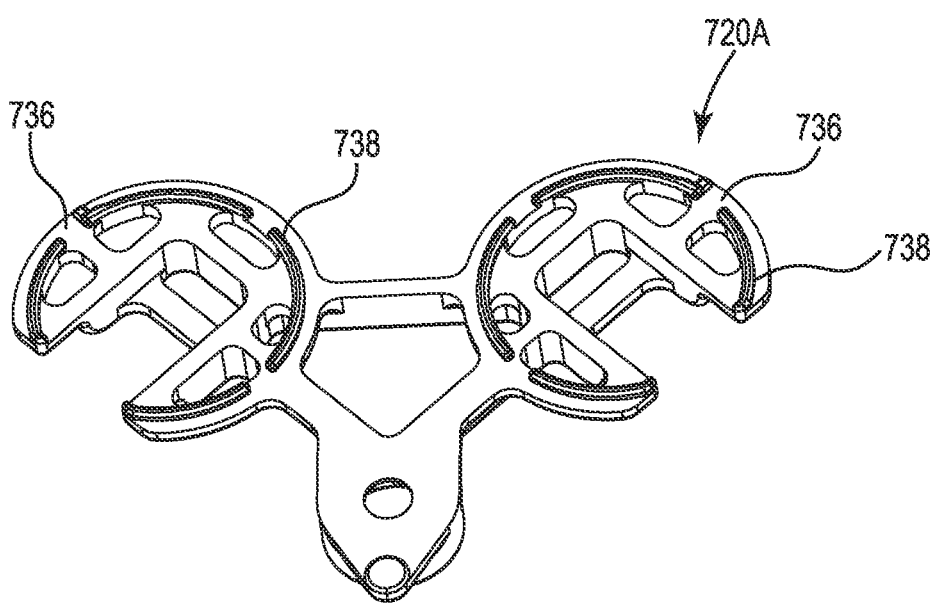
Figure 22A:
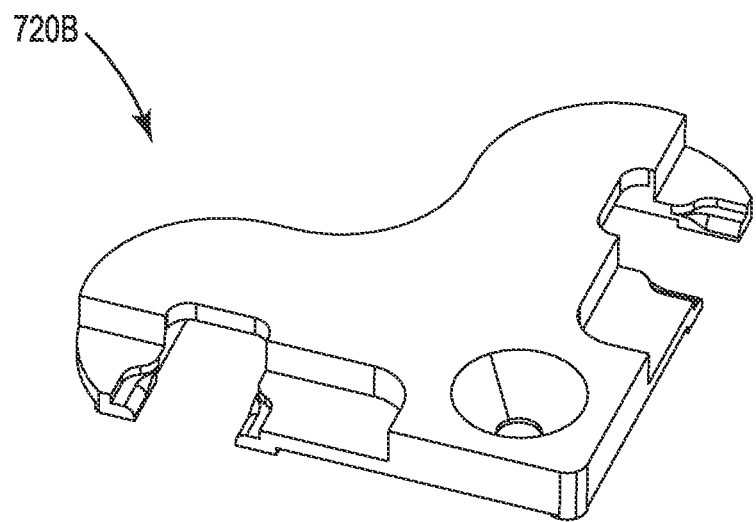
FIGS. 22A and 22B show top and bottom perspective views of a cap which forms a portion of the reticle retainer in accordance with another embodiment of the disclosure.
Figure 22B:
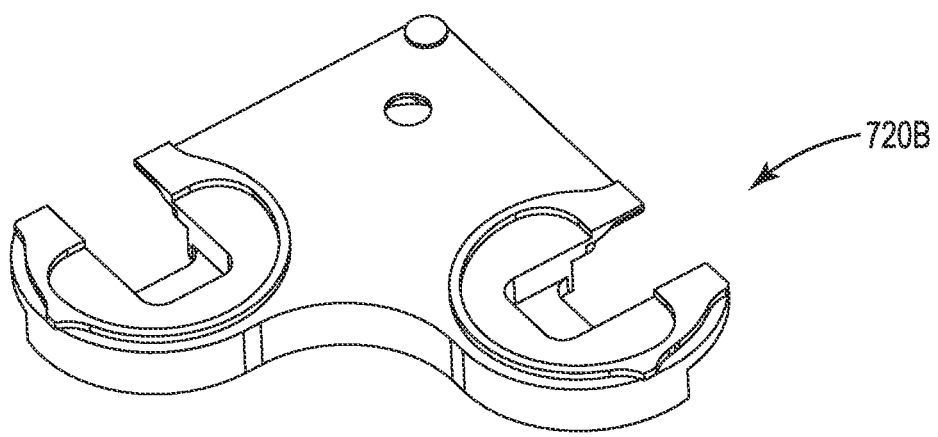

FIGS. 21A and 21B show top and bottom views of a cap 720A according to one embodiment. In use, the cap 720A is disposed over and in contact with the reticle contact member 716 and the resilient member 718. The cap 720A includes two generally circular or C-shaped bracket members 736 that contact and retrain side to side movement of the two reticle contact members 716 that are located adjacent one another. In some cases, as best viewed in FIG. 21B, each of the bracket members 736 includes a circular ridge 738 that contacts and applies a pressure to the resilient member 718. Additionally, the cap includes an aperture 740 for receiving a fastener such as a screw that is spaced apart from each of the bracket member 736. The bracket members 736 and the aperture 740 are positioned relative to one another such that a triangle can be defined by drawing lines through each of their center points. FIGS. 22A and 22B show a similar cap 720B. The primary different is that the cap 720B is more solid than the cap 720A due to differences in manufacturing. One of ordinary skill in the art will readily recognize that the function of the cap 720B and the relationship between the parts remains the same.

Figure 23A:
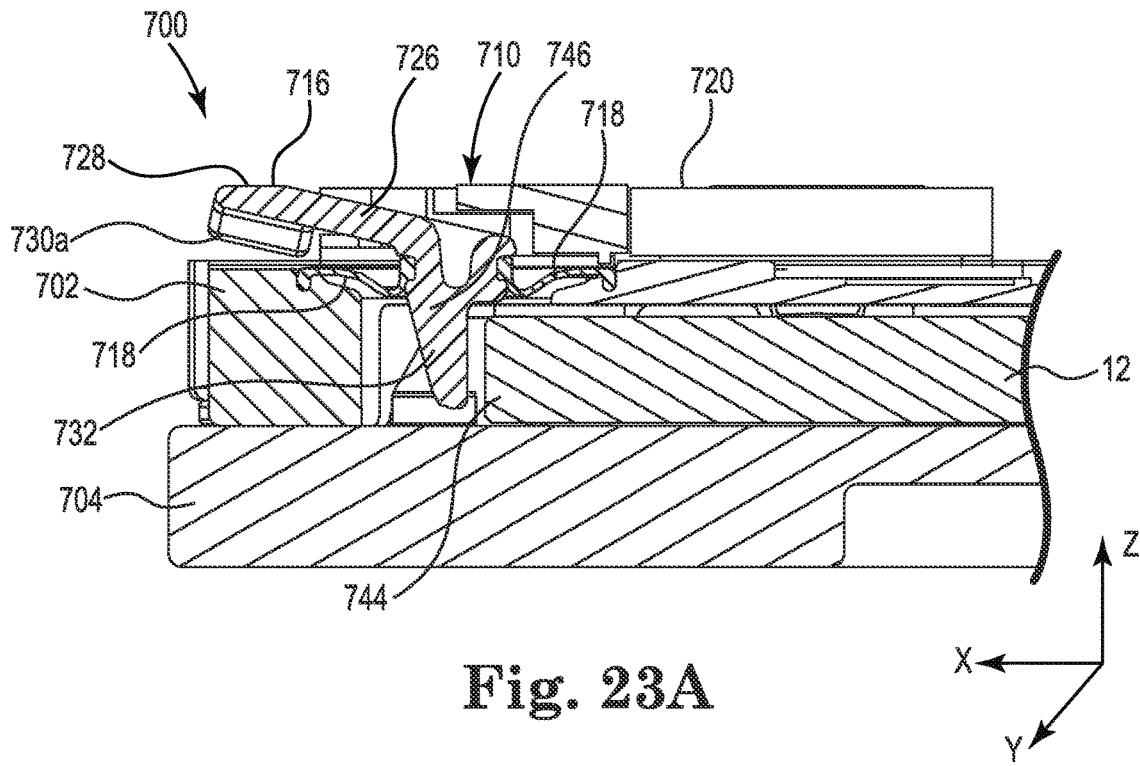
FIGS. 23A and 23B are partial, side cross-sectional views of the inner pod showing the reticle retainer in a first position and a second position.
Figure 23B:
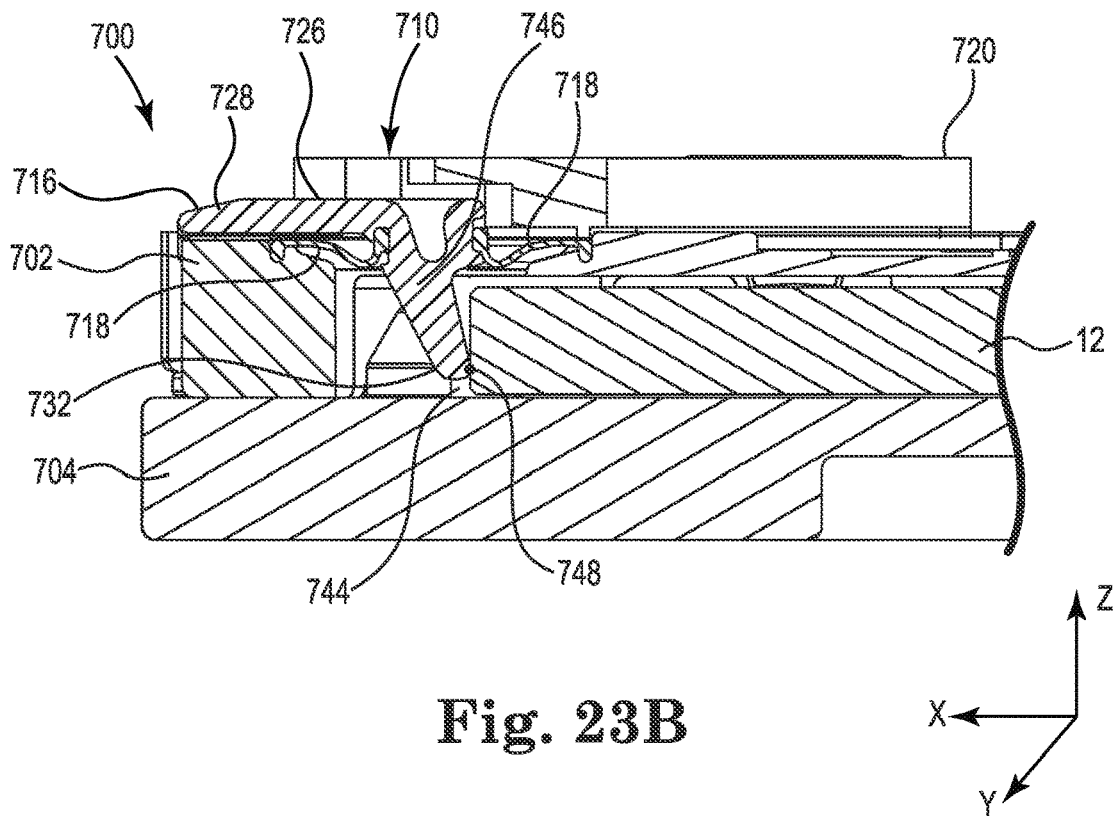

FIGS. 23A and 23B show cross-section views of the inner pod 700 including the reticle retainer 710. FIG. 23A shows the reticle retainer 710 in a first, non-contact position and FIG. 23B shows the reticle retainer 710 in a second, contact position in which the leg 732 of the reticle contact member 716 has been brought into contact with a side surface 744 of the reticle 12 upon application of a downward force in the Z-direction to the arm 726 and/or cross member 728. Upon application of a downward force to the arm 726 and/or cross-member 728 of the reticle contact member 716, the reticle contact member 716 pivots or rotates about a first axis of rotation 746, causing the shoulders 730a, 730b, of which only 730a is visible in the figures, to move downward to be received in the recesses, and also causing the leg 732 to pivot forward towards the side surface 744 of the reticle 12. Rotation about the first axis of rotation 746 ceases when the leg 732 contacts the side surface 744 of the reticle 12 as shown in FIG. 23B. A second axis of rotation 748 is created by the reticle 12 pushing back on the leg 732. However, the return action of the reticle 12 pushing back on the leg 732 action causes additional force to be placed on the shoulders 730a, 730b received in the recess 722, further strengthening and stabilizing the point of contact between the reticle contact member 716 and the reticle 716. In addition, the axis of rotation 746 is flexible, and changes from rotation axis 746 to rotation axis 748. This shift or change in the rotation axis from the first axis of rotation 746 to the second axis of rotation 748 is provided by the resilient member 718. The resilient member 718 provides a sufficient amount of flexibility such that the first axis of rotation 746 can shift in the X plane when the leg 732 contacts the side surface 744 of the reticle 12 at the second rotational axis 748. In response to contact between the leg 732 and the side surface 744, the resilient member 718 flexes to help main side contact between the leg 732 and the reticle 12 preventing movement of the reticle 12 in the X and/or Y plane. Referring back to FIG. 18, constraining the reticle 12 in the X and Y planes by contacting the side surface 744 of the reticle 12 may reduce amount of the load need in the Z direction which may be applied by additional reticle retainers 714.

Figure 24:
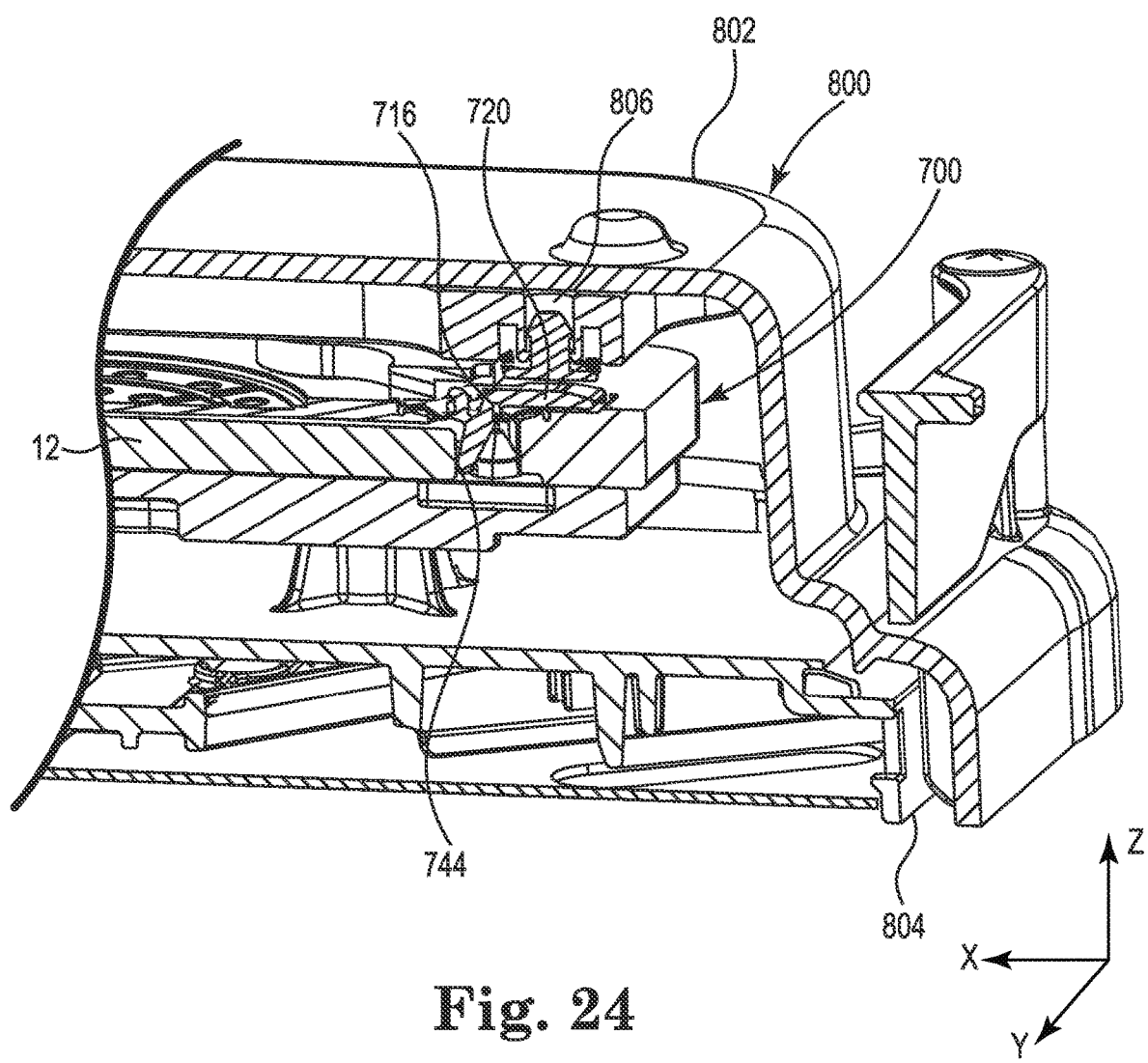
FIG. 24 is a partial cross-sectional view of a reticle pod assembly showing an inner pod disposed within an outer pod.

FIG. 24 is partial cross-sectional view showing the inner pod 700 contained within an outer pod 800 forming a dual pod assembly. The outer pod 800 includes an outer pod cover 802 and an outer pod base 804. The outer pod cover 802 includes at least one contact member or pad 806 that, when the inner pod 700 is contained within the outer pod, contacts and applies a downward pressure in the Z-direction to the arm 726 and/or cross member 728 of the reticle contact member 716. The number of contact members or pads 806 incorporated into the outer pod cover 802 corresponds in a one to one manner with the number of reticle contact member 716. The downward application force in the Z-direction to the arm 726 and/or cross member 728 causes the reticle contact member to 716 to engage a side surface 744 of the reticle 12 constraining and/or preventing the reticle 12 from side to side movement in the X and Y planes. Referring back to FIG. 18, constraining the reticle 12 in the X and Y planes by contacting the side surface 744 of the reticle 12 may reduce amount of the load need in the Z direction which may be applied by additional reticle retainers 714.

Figure 25:
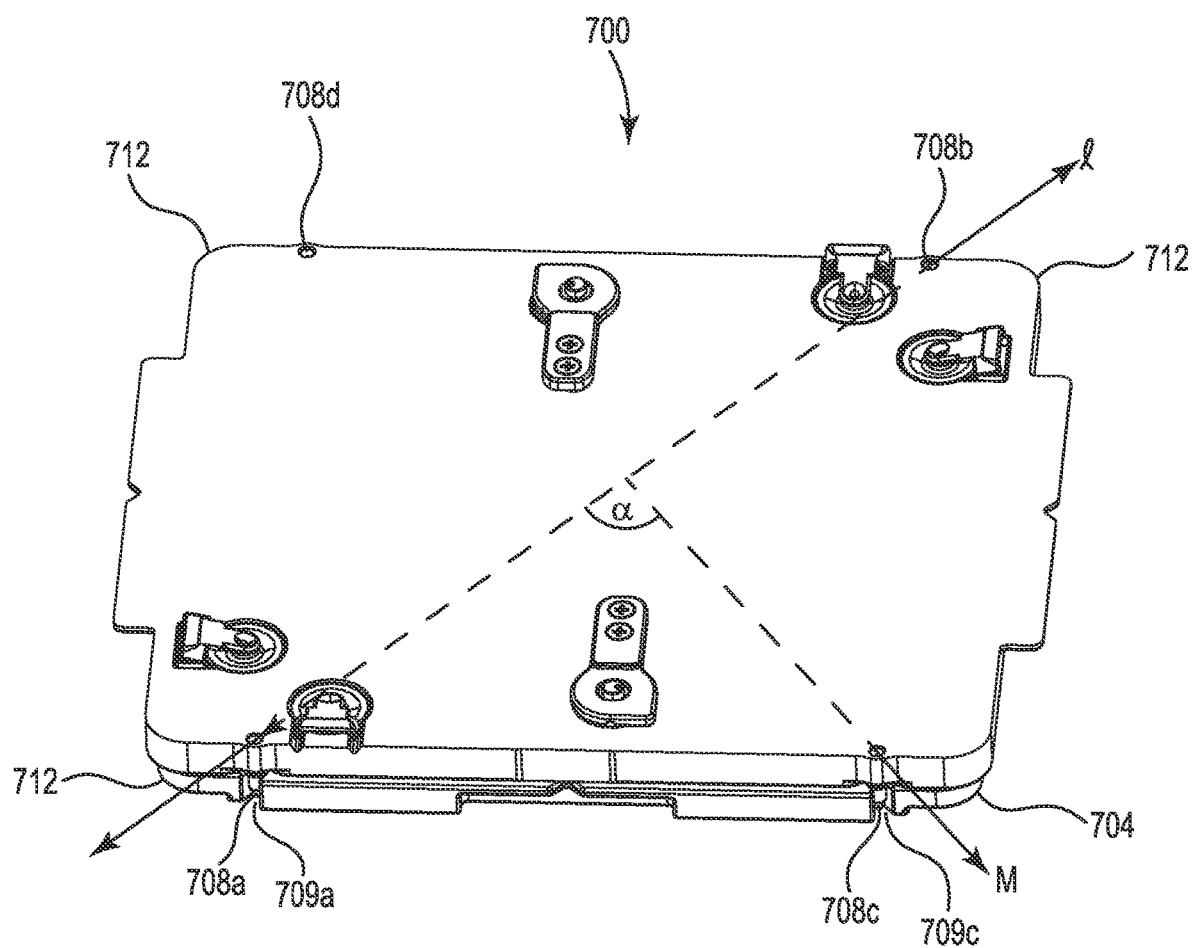
FIG. 25 is a simplified, perspective view of the inner pod shown in FIG. 18.

FIG. 25 is a simplified view of the inner pod 700 shown in FIG. 19 showing the relative locations of the locating pins 708a, 708b, 708c, and 708d to one another. Each of the pins 708a-708d are located adjacent a corner 712 of the inner pod 700. As shown in FIG. 25 and as described previously herein, each of the pins 708a-708d are received in a corresponding recesses defined in the base 704. For example, as can be seen in FIG. 25, pin 708a is received in corresponding recess 709a and pin 708c is received in recess 709c. As described previously herein, the corresponding pins and recesses cooperate together to guide and align the cover 702 over the base 704 and also to retain the cover 702 in position when the cover 702 is engaged with the base 704. Additionally, the location of the pins and recesses relative to one another add in resisting movement of the cover 702 relative to the base 704 in the X and Y planes and also help to resist any rotational movement of the cover 702 relative to the base.

As can be seen in FIG. 25, a first set of pins 708a, 708b and their corresponding recesses, of which only recess 709a is visible, are located in a first vertical plane defined by a first axis 1. At least a third pin 708c and corresponding recess 709c is located in a second vertical plane defined by a second axis M. The fourth pin 708d and its corresponding recess is optional. In some cases, the second vertical plane defined by the second axis m bisects the first vertical plane defined by the first axis 1 at an angle α ranging from about 60 degrees to about 110 degrees, and more particularly, at an angle α ranging from about 60 degrees to about 90 degrees. In other cases, the second vertical plane defined by the second axis m bisects the first vertical plane defined by the first axis 1 at an orthogonal or 90 degree angle. Placing a third pin 708c and recess 709c on an axis or in a plane that is on-angle or in some cases, orthogonal, relative to a first axis or plane defined by a first set of pins limits movement of the cover 702 relative to the base in both direction of the 1 axis. In addition, the width of the pin relative to the width of the recess is selected such that when the cover 702 is seated on the base 704 and the pin, such as pin 708a, is received in a corresponding recess, such as 709a, the cover 702 is resistant to rotational movement. This resistant to movement in the X and Y planes of the cover 702 relative to the base 704 may also be accomplished by placing the three pins 708a, 708b, and 708c and their corresponding recesses on-center relative to one another.

Figure 26:
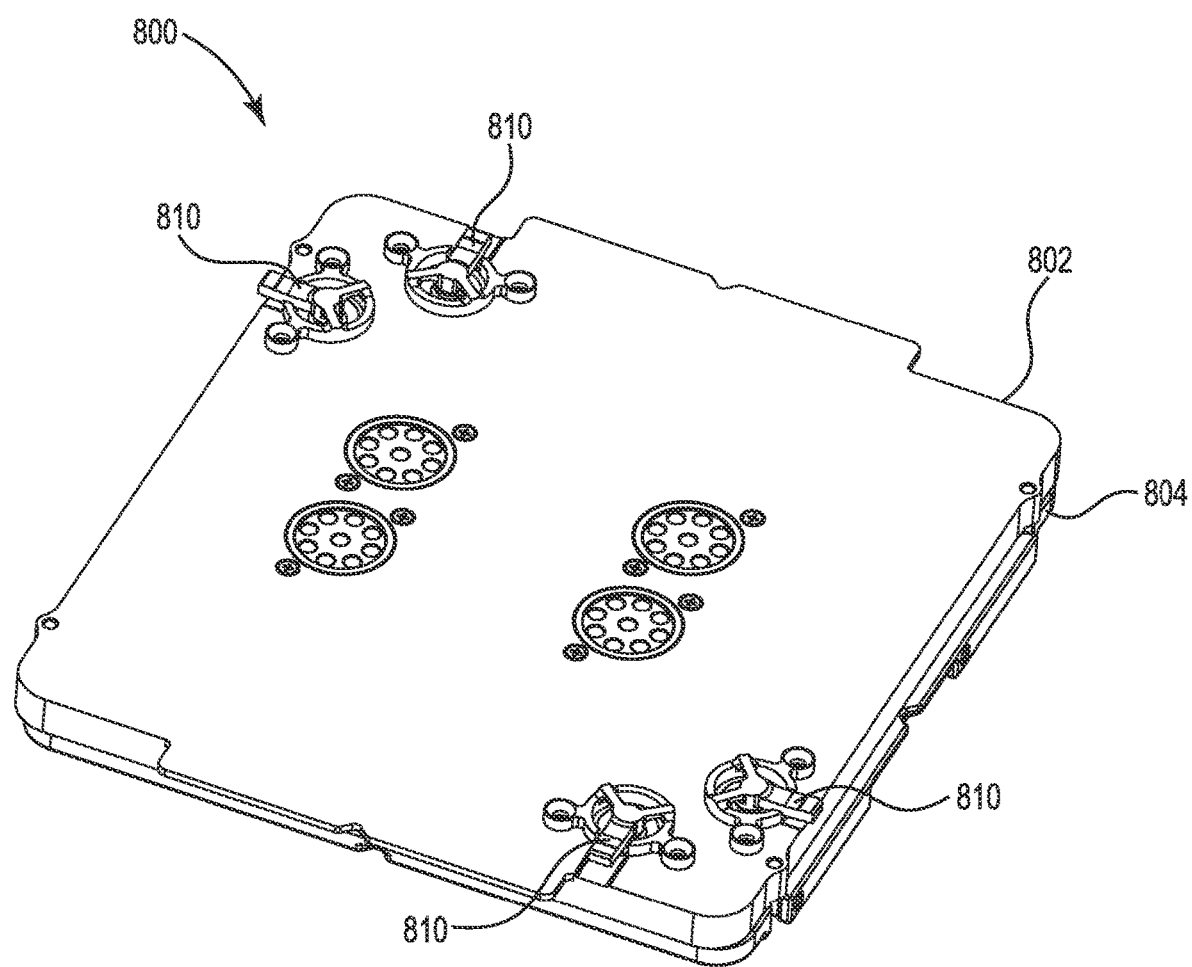
FIG. 26 is a perspective view of an inner pod in accordance with yet another embodiment of the disclosure.

FIGS. 26-29C relate to yet another embodiment of the disclosure. FIG. 26 is a perspective view of an inner pod 800 including one or more reticle retainers 810 according to still other embodiments. The inner pod 800 includes an inner pod cover 802 configured to mate with the inner pod base 804 to define a sealed environment. A reticle can be contained within the sealed environment. The inner pod cover 802 has a size and shape generally corresponding to the size and shape of the inner pod base 804. In some cases, the inner pod cover 802 may include a plurality of protrusions or pins sized and configured to be received by a plurality of corresponding recesses or notches defined in an edge of the base 804. The pins and notches cooperate together to guide and align the cover 802 over the base 804, and also to retain the cover 802 in position when the cover 802 is engaged with the base 804.

As shown in FIG. 26, the inner pod cover 802 also incorporates one or more pairs of reticle retainers 810. The reticle retainers 810 help to reduce or prevent movement of the reticle that may generate particles. The number and location of the reticle retainers 810 can vary depending upon the size of the overall pod and the load to be applied to the reticle contained within the inner pod. The reticle retainers 810 are incorporated into the inner pod cover 802 such that when the inner pod cover 802 is closed the reticle retainers collectively constrain horizontal or side to side movement of the reticle in the X and Y planes in addition to the Z-direction. Each reticle retainer is 810 is configured to contact a side surface of the reticle. Each pair of reticle retainers 810 is located on the inner pod cover 802 such that the two reticle retainers 810 work together to constrain a corner of the reticle from movement in the X and Y planes. In some embodiments, as shown, the reticle retainers 810 engage the side of the reticle in response to a downward force applied to the retainer in the Z-direction by a corresponding structure provided on the inner surface of the outer pod cover. Unlike previous embodiments described herein, the reticle retainers 810 do not intentionally contact a top surface of the reticle.

Figure 27:
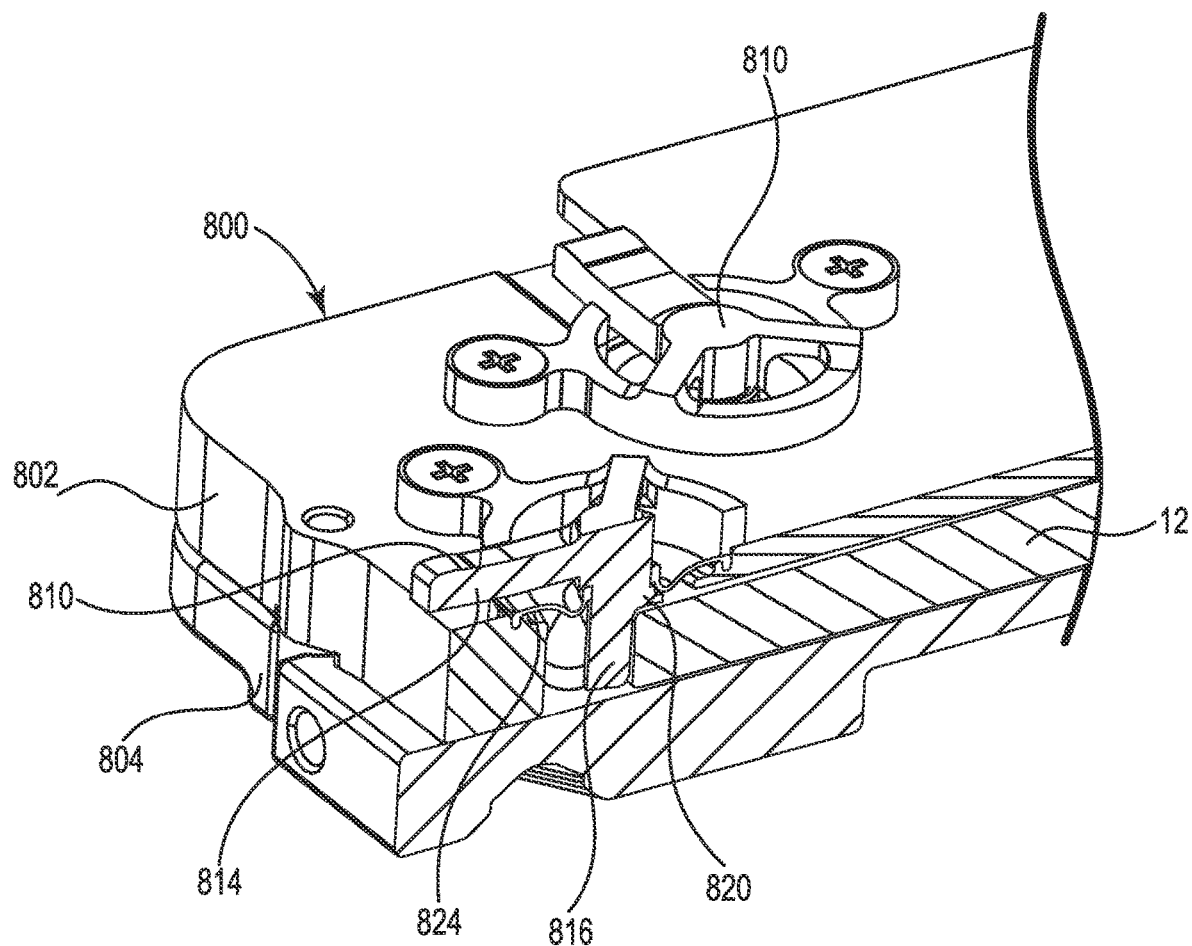
FIGS. 27 and 28 are cross-sectional views of a portion of the inner pod shown in FIG. 26.
Figure 28:
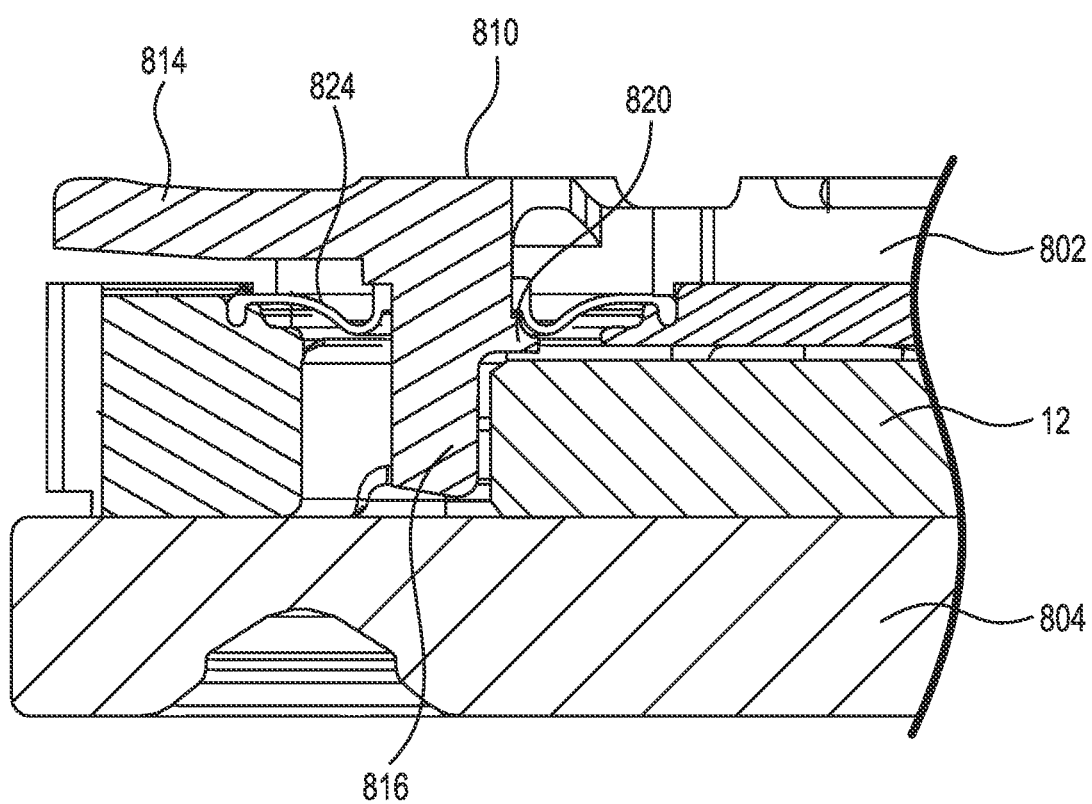
Figure 29A:
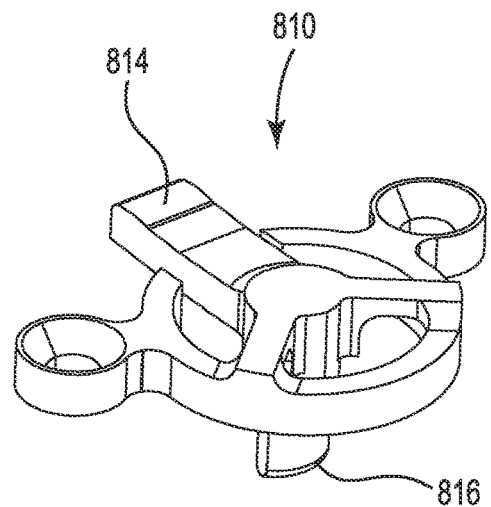
FIGS. 29A-29C are different views of a reticle retainer in accordance with yet another embodiment of the disclosure.
Figure 29B:
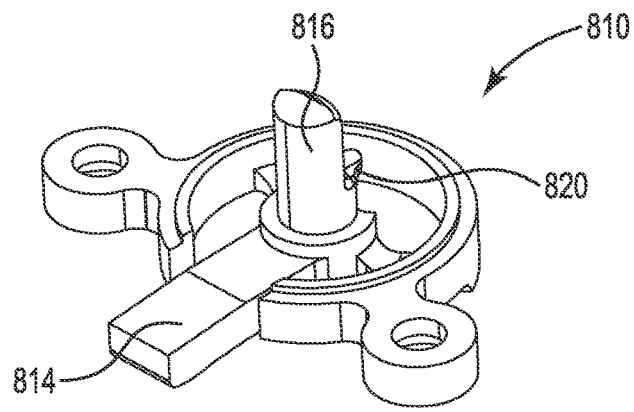
Figure 29C:
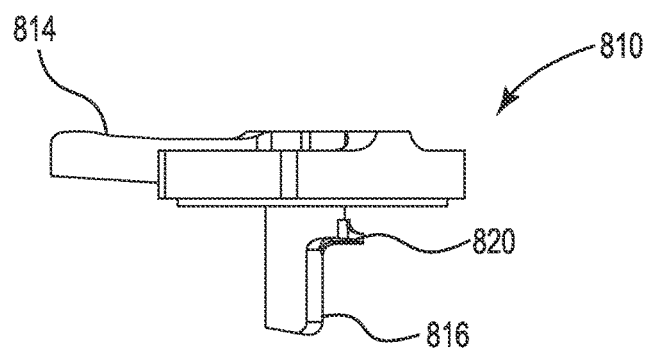

FIGS. 27 and 28 are different cross-sectional views of the inner pod including a reticle retainer 810 and FIGS. 29A-29C are different views of an individual reticle retainer 810. Each reticle retainer 810 includes an arm 814 and a main body portion 816. The arm extends in a direction that is perpendicular to the direction in which the main body portion 816 extends. For example, in some cases, the arm 814 extends in an X or Y direction and the main body portion 816 extends in a Z-direction. The main body portion 816 contacts the side surface 818 of the reticle 12 in response to application of a downward force in the Z-direction to the arm 814 by a corresponding structure provided on the inner surface of the outer pod cover. Upon side contact, some centering of reticle will occur, but force during sliding will be minimal. Friction between the reticle and the reticle retainers also limits motion of the reticle in the X and Y direction during transit. In some cases, as shown in FIG. 27, the main body port 816 can include a shoulder portion 820 that is positioned above a top surface of the reticle to limit movement of the reticle in the Z-direction as necessary. The shoulder portion 820 is not intended to contact a top surface of the reticle 12. Rather, the shoulder portion 820 limits movement of the reticle 12 in the Z direction as necessary in response to a shock event. Additionally, the reticle retainer 810 can include a seal 824 that surrounds the main body portion 816, and which may help to prevent particulate matter from entering the inner pod.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respect, only illustrative. Changes may be made in details, particularly in matters of shape, size, and arrangement of parts without exceeding the scope of the disclosure. The disclosure's scope is, of course, defined in the language in which the appended claims are expressed.

What is claimed is:

1. A reticle pod for holding a reticle comprising:
   a base configured to support a reticle thereon;
   a cover having a top surface and configured to mate with the base; and
   one or more reticle retainers each including a reticle contact member configured to contact a side wall of a reticle to limit movement of the reticle, each reticle contact member including an outwardly extending arm and a downwardly extending leg that extends through the cover, wherein upon actuation of the arm, the downwardly extending leg is configured to move in a direction toward the side wall of the reticle and contact a lateral side wall of the reticle.

2. The reticle pod of claim 1, wherein each of the one or more reticle retainers includes a cap secured to the cover.

3. The reticle pod of claim 1, wherein the outwardly extending arm extends at least partially above a top surface of the cover.

4. The reticle pod of claim 1, wherein the outwardly extending arm comprises at least one downwardly extending member.

5. The reticle pod of claim 1 wherein the cover further comprises a recess configured to receive the at least one downwardly extending member upon actuation of the outwardly extending arm.

6. The reticle pod of claim 1, wherein the reticle contact member further includes a cross member that forms a T-shape with the outwardly extending arm, the cross member having at least one downwardly extending member.

\* \* \* \* \*